United States Patent
Kimura

(10) Patent No.: US 9,761,625 B2
(45) Date of Patent: Sep. 12, 2017

(54) IMAGE SENSOR HAVING OVERLAPPING EXPOSURE REGIONS AND PIXELS WITH MISALIGNED PHOTODIODES

(71) Applicant: Renesas Electronics Corporation, Tokyo (JP)

(72) Inventor: Masatoshi Kimura, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/077,011

(22) Filed: Mar. 22, 2016

(65) Prior Publication Data

US 2016/0284759 A1   Sep. 29, 2016

(30) Foreign Application Priority Data

Mar. 27, 2015 (JP) ................................. 2015-067714

(51) Int. Cl.
*H01L 27/146* (2006.01)
*H04N 5/232* (2006.01)
*H04N 5/369* (2011.01)

(52) U.S. Cl.
CPC .. *H01L 27/14643* (2013.01); *H01L 27/14605* (2013.01); *H01L 27/14641* (2013.01); *H04N 5/23212* (2013.01); *H04N 5/3696* (2013.01); *H04N 5/3694* (2013.01)

(58) Field of Classification Search
USPC ........ 257/438, 443, 446, 291, 292, 293, 294
See application file for complete search history.

(56) References Cited

U.S. PATENT DOCUMENTS

| 5,888,676 | A | 3/1999 | Saitoh |
| 7,732,239 | B2 * | 6/2010 | Kimura ............. H01L 27/14603 257/E21.133 |
| 7,736,985 | B2 | 6/2010 | Enomoto et al. |
| 2015/0312461 | A1 * | 10/2015 | Kim .................. H01L 27/14609 348/308 |
| 2015/0357368 | A1 * | 12/2015 | Kimura ............. H01L 27/14621 257/292 |
| 2016/0295144 | A1 * | 10/2016 | Kimura ............. H01L 27/14603 |

FOREIGN PATENT DOCUMENTS

| JP | 06-324474 A | 11/1994 |
| JP | 9-190962 A | 7/1997 |
| JP | 2003-005346 A | 1/2003 |
| JP | 2008-008729 A | 1/2008 |
| JP | 2014-102292 A | 6/2014 |

* cited by examiner

*Primary Examiner* — Marc Armand
*Assistant Examiner* — Younes Boulghassoul
(74) *Attorney, Agent, or Firm* — Sughrue Mion, PLLC

(57) ABSTRACT

In a solid state image sensor which has two photodiodes juxtaposed in a predetermined direction in each pixel and is formed by carrying out divided exposure, that is, exposure treatment of an entire chip by a plurality of times of exposure, image quality is improved and autofocusing speed is increased. Provided is a solid state image sensor having a first exposure region having a first region and a second exposure region having a second region. They overlap with each other in a third region between the first and second regions. In a pixel formed in the third region, a photodiode formed through a mask for first exposure region is placed at a position closer to the side of the second region than another photodiode formed through a mask for second exposure region is.

15 Claims, 25 Drawing Sheets

IMAGE SENSOR HAVING OVERLAPPING EXPOSURE REGIONS AND PIXELS WITH MISALIGNED PHOTODIODES

CROSS-REFERENCE TO RELATED APPLICATIONS

The disclosure of Japanese Patent Application No. 2015-067714 filed on Mar. 27, 2015 including the specification, drawings, and abstract is incorporated herein by reference in its entirety.

BACKGROUND

The present invention relates to a semiconductor device, in particular, to a technology effective when applied to a semiconductor device including a solid state image sensor.

When an image sensor (picture element) to be used in digital cameras or the like has a large chip size in order to have an improved image quality, divided exposure treatment is performed a plurality of times during a manufacturing step of it because single exposure treatment is insufficient for the exposure of the entire chip.

It is known that in a solid state image sensor used in digital cameras having an autofocus system function to which an image-plane phase-detection technology has been applied, a plurality of pixels configures the image sensor and they are each equipped with two or more photodiodes. In this case, at the time of focusing, two photodiodes in a pixel having one microlens have an equal imaging output in principle.

Patent Document 1 (Japanese Unexamined Patent Application Publication No. 1994-324474) describes discrete and irregular arrangement of pixels at the connection making inconspicuous image abnormalities at the connection due to divided exposure.

Patent Document 2 (Japanese Unexamined Patent Application Publication No. 1997-190962) describes a boundary of divided exposure in nonlinear form.

Patent Document 3 (Japanese Unexamined Patent Application Publication No. 2003-005346) describes a method of dividing a pixel pattern with a zigzag dividing line into a plurality of divided regions and forming a double exposure pattern, which is a pattern exposed doubly, between the divided regions adjacent to each other.

Patent Document 4 (Japanese Unexamined Patent Application Publication No. 2014-102292) describes a photomask having an overlapped region between two divided regions and equipped with a plurality of light shielding patterns, a light transmission portion, and a light reduction portion. The light reduction portion has a light transmittance greater than that of the light shielding pattern and smaller than that of the light transmission portion.

Patent Document 5 (Japanese Unexamined Patent Application Publication No. 2008-008729) describes a connector exposure region placed so as to locate the width-direction center of the connector exposure region at the center on a line connecting the respective centers of oscillators above and below the connector exposure region.

PATENT DOCUMENTS

[Patent Document 1] Japanese Unexamined Patent Application Publication No. 1994-324474
[Patent Document 2] Japanese Unexamined Patent Application Publication No. 1997-190962
[Patent Document 3] Japanese Unexamined Patent Application Publication No. 2003-005346
[Patent Document 4] Japanese Unexamined Patent Application Publication No. 2014-102292
[Patent Document 5] Japanese Unexamined Patent Application Publication No. 2008-008729

SUMMARY

When a chip having a large area is formed by divided exposure, exposure treatment is performed using different masks according to exposure steps to be performed twice or more. Size variation or misregistration may then occur due to the masks or an exposure apparatus used. In this case, due to misregistration in a distance among respective patterns formed using a plurality of masks, there may occur problems such as image abnormalities resulting from a difference in output value in an image sensor or prevention of normal autofocus detection. In particular, in an image or picture obtained by imaging, linear image abnormalities may appear at a position of a solid state image sensor corresponding to a boundary between regions exposed through masks.

Another object and novel features will be apparent from the description herein and accompanying drawings.

Of the embodiments disclosed herein, a typical one will next be outlined simply.

In a semiconductor device according to one embodiment, a first exposure region having a first region and a second exposure region having a second region overlap with each other in a third region between the first region and the second region; and in a pixel formed in the third region, a photodiode formed through a mask for the first exposure region is placed at a position closer to the side of the second region than a photodiode formed through a mask for the second exposure region is.

According to the one embodiment disclosed by the present application, a semiconductor device having improved performance can be provided.

DETAILED DESCRIPTION

Figure 1:
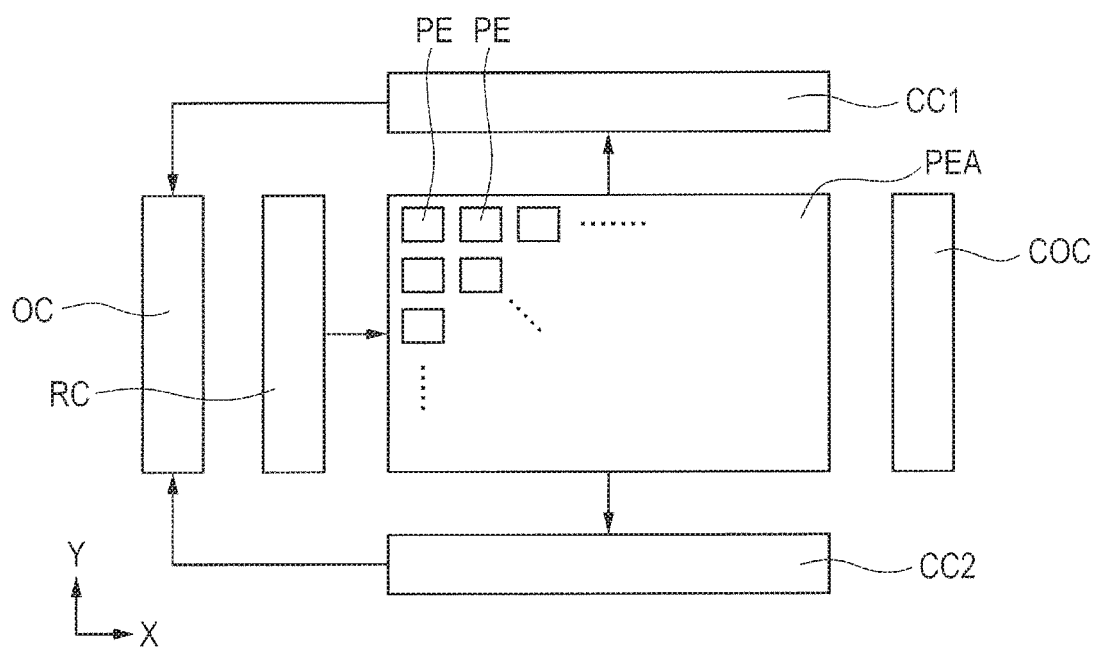
FIG. 1 is a schematic view showing the configuration of a semiconductor device of First Embodiment of the invention.

Embodiments of the invention will hereinafter be described in detail based on drawings. In all the drawings for describing the embodiments, members having the same function will be identified by the same reference numerals and overlapping descriptions will be omitted. In the present invention, a photodiode inside each of pixels identified by the same reference numeral has the same configuration.

In the following embodiments, a description on the same or similar portions will not be repeated in principle unless particularly necessary. The term "mask" as used herein is a photomask (reticle) to be used during exposure in a photolithography step except for a hard mask or photoresist film to be used as a protecting film for etching or ion implantation.

First Embodiment

A semiconductor device of the present embodiment will hereinafter be described referring to FIGS. 1 to 5. The semiconductor device of the present embodiment relates to a solid state image sensor, in particular, a solid state image sensor having a plurality of photodiodes in one pixel.

FIG. 1 is a schematic view showing the configuration of the solid state image sensor according to the present embodiment. The solid state image sensor included in the semiconductor device of the present embodiment is a CMOS (complementary metal oxide semiconductor) image sensor. As is shown in FIG. 1, it is equipped with a pixel array portion PEA, readout circuits CC1 and CC2, an output circuit OC, a row selection circuit RC, and a control circuit COC.

The pixel array portion PEA has therein a plurality of pixels PE in matrix form. An X-axis direction shown in FIG. 1 is a direction along the main surface of a semiconductor substrate configuring the solid state image sensor and is also a direction along a row direction along which pixels PE have been arranged. A Y-axis direction along the main surface of the semiconductor substrate and orthogonal to the X-axis direction is a direction along a column direction along which the pixels PE have been arranged. In short, the pixels PE are juxtaposed in matrix form.

The pixels PE each generate a signal depending on the intensity of irradiated light. The row selection circuit RC selects the pixels PE on a row unit basis. The pixels PE selected by the row selectin circuit RC output the signal thus generated to an output line (refer to FIG. 5) which will be described later. The readout circuits CC1 and CC2 are opposite to each other in the Y-axis direction so as to sandwich therebetween the pixel array portion PEA. The readout circuits CC1 and CC2 each read out a signal output from the pixel PE to the output line OL and output it to the output circuit OC.

The readout circuit CC1 reads out the signal of half of the pixels PE on the side of the readout circuit CC1 and the readout circuit CC2 reads out the signal of the remaining half pixels on the side of the readout circuit CC2. The output circuit OC outputs the signal of the pixels PE readout by the readout circuits CC1 and CC2 to outside the solid state image sensor. The control circuit COC integrally manages the operation of the entire solid state image sensor and controls the operation of the other constituent elements of the solid state image sensor.

Figure 2:
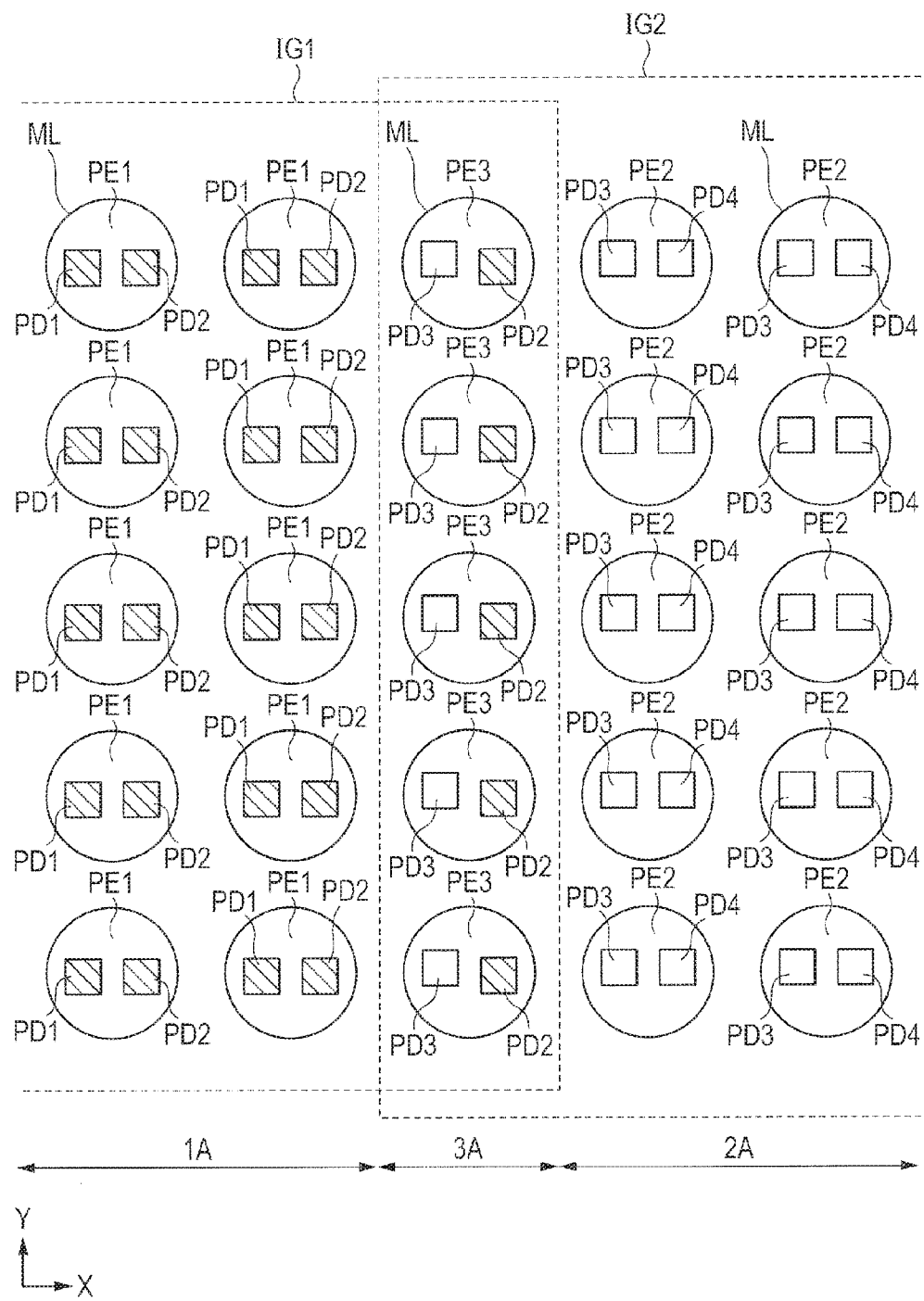
FIG. 2 is a planar layout showing a partially enlarged view of FIG. 1.
Figure 3:
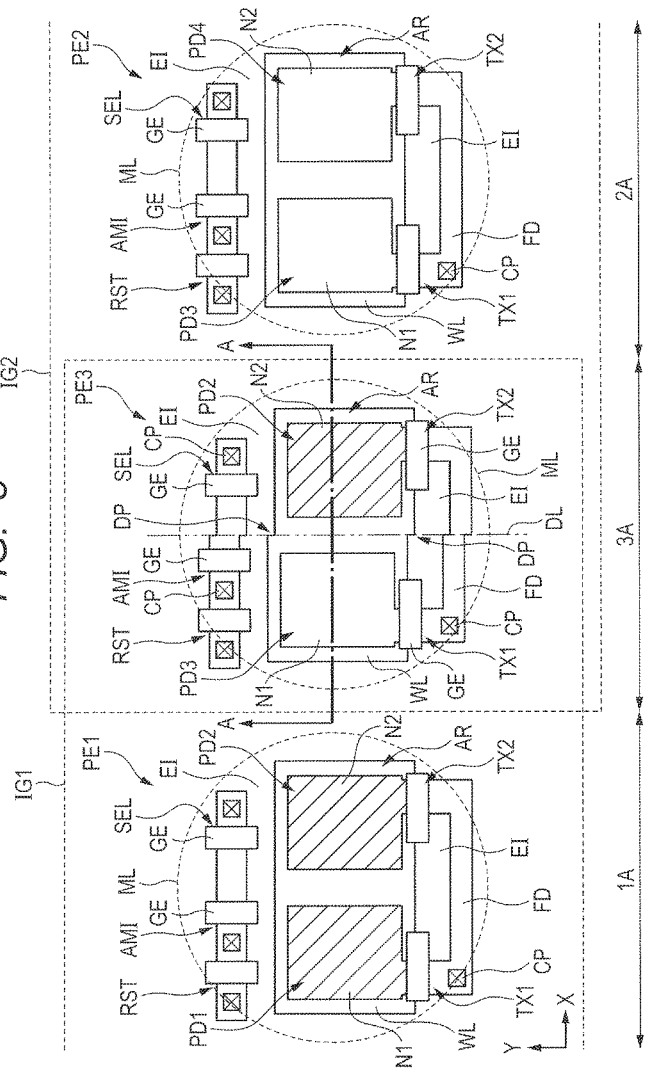
FIG. 3 is a planar layout showing the semiconductor device of First Embodiment of the invention.
Figure 4:
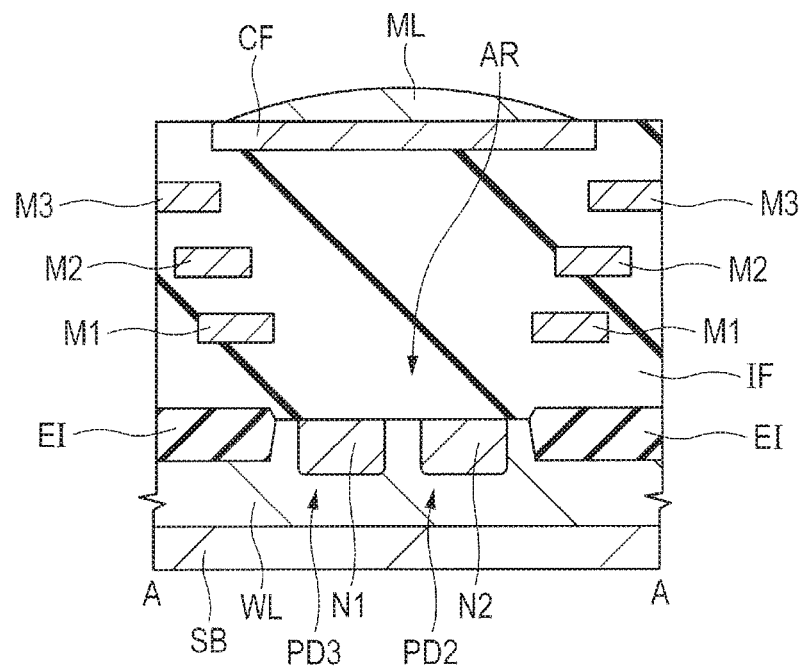
FIG. 4 is a cross-sectional view taken along the line A-A of FIG. 3.

Next, FIGS. 2 and 3 each show a planar layout of pixels PE. FIG. 4 shows a cross-sectional view taken along the line A-A of FIG. 3. FIG. 2 is a planar layout showing a partially enlarged view of the pixel array portion PEA shown in FIG. 1. FIG. 3 is an enlarged planar layout showing three pixels PE1 to PE3 shown in FIG. 2. FIGS. 2 and 3 omit an interlayer insulating film, a wiring, and the like provided on photodiodes and transistors at the periphery thereof. FIG. 2 shows only a microlens possessed by each pixel and two photodiodes formed in each pixel.

As shown in FIG. 2, a semiconductor substrate configuring the solid state image sensor has, on the upper surface thereof, a plurality of pixels PE1, PE2, and PE3 arranged in matrix (array) form in the X-axis and Y-axis directions. The pixels PE1, PE2, and PE3 correspond to the plurality of pixels PE shown in FIG. 1. FIG. 2 shows a first exposure region IG1 and a second exposure region IG2 configuring the pixel array portion PEA (refer to FIG. 1) and also shows a first region 1A, a second region 2A, and a third region 3A that divide the first exposure region IG1 and the second exposure region IG2 into three regions.

In the plan view or planar layout of the present application, a photodiode formed through a mask for first exposure region IG1 is hatched to facilitate understanding of them. A photodiode formed through a mask for second exposure region IG2 is, on the other hand, not hatched.

The first exposure region IG1 and the second exposure region IG2 overlap, at each end portion thereof, with each other at the center portion of the pixel array portion PEA in the X-axis direction. The first region 1A is a region which is in the first exposure region IG1 but does not overlap with the second exposure region IG2 in plan view; the second region 2A is a region which is in the second exposure region IG2 but does not overlap with the first exposure region IG1 in plan view; and the third region 3A is a region where the first exposure region IG1 and the second exposure region IG2 overlap with each other in plan view.

In other words, the first exposure region IG1 has the first region 1A and the third region 3A and the second exposure region IG2 has the second region 2A and the third region 3A. For example, the third region 3A is a region having an X-axis direction width smaller than that of the first region 1A or the second region 2A. The first region 1A and the second region 2A are almost equal in area. This means that the first exposure region IG1 and the second exposure region IG2 are almost equal in area.

FIG. 2 shows the contour of each of the first exposure region IG1 and the second exposure region IG2 by a dotted line. FIG. 2 shows the structure in which five pixels are arranged in both the X-axis direction and the Y-axis direction, but the number of pixels in an actual structure is larger in both the X-axis direction and in the Y-axis direction.

In the first region 1A, a plurality of pixels PE1 is placed in matrix form in both the X-axis direction and Y-axis direction. In the second region 2A, a plurality of pixels PE2 is arranged in matrix form in both the X-axis direction and Y-axis direction. In the third region 3A between the first region 1A and the second region 2A, a plurality of pixels PE3 is arranged in the Y-axis direction. The pixels PE1, PE2, and PE3 are arranged in matrix form. This means that a plurality of pixels PE1 and a plurality of pixels PE2, and a pixel PE3 are arranged in the X-axis direction (first direction). The pixels PE1 to PE3 arranged in the X-axis direction configure a single row and a plurality of this rows arranged in the Y-axis direction (second direction) configure the pixel array portion PEA (refer to FIG. 1).

The pixels PE1 to PE3 each have a microlens ML. The pixels PE1 to PE3 each have two photodiodes that overlap with the microlens ML in plan view. More specifically, the pixels PE1 each have photodiodes PD1 and PD2 formed on the main surface of a semiconductor substrate; the pixels PE2 each have photodiodes PD3 and PD4 formed on the main surface of the semiconductor substrate; and the pixels PE3 each have photodiodes PD3 and PD2 formed on the main surface of the semiconductor substrate. The photodiodes PD1 to PD4 each have a substantially rectangular shape in plan view.

When the first direction is a direction extending from the side of the first region 1A to the side of the second region 2A, the photodiodes PD1 and PD2 in the pixel PE1 are juxtaposed in this order in the first direction and the photodiodes PD3 and PD4 in the pixel PE2 are juxtaposed in this order in the first direction. In other words, in the pixel PE1, the photodiode PD2 is placed in a region closer to the second region 2A than the photodiode PD1 is and in the pixel PE2, the photodiode PD3 is placed in a region closer to the first region 1A than the photodiode PD4 is.

In the pixel PE3, the photodiode PD2 is placed in a region closer to the second region 2A than the photodiode PD3 is. This means that in the pixel PE3, the photodiode PD3 is placed in a region closer to the first region 1A than the photodiode PD2 is. The photodiodes PD1 and PD2 are arranged in the first direction in the pixel PE1 and the photodiodes PD3 and PD4 are arranged in the first direction in the pixel PE2, while the photodiodes PD3 and PD2 are, in a strict sense, not arranged in the first direction in the pixel PE3 and one of the photodiodes PD3 and PD2 is arranged at a position deviated from the other one in one direction.

Strictly speaking, the photodiodes PD1 and PD2 in the pixel PE1 and the photodiodes PD3 and PD4 in the pixel PE2 are not juxtaposed in the first direction and the photodiodes PD1 and PD2 are arranged at a position deviated from the photodiodes PD3 and PD4 in one direction. This means that the photodiodes PD1 and PD2 in the pixels PE1 and PE3 are arranged at a position deviated from the photodiodes PD3 and PD4 in the pixels PE2 and PE3 in the same direction.

A distance between the photodiodes PD1 and PD2 in the pixel PE1 is equal to that between the photodiodes PD3 and PD4 in the pixel PE2. In the pixel PE3, on the other hand, since there is a deviation between the respective formation positions of the photodiode PD2 and the photodiode PD3, a distance between these two photodiodes in the pixel PE3 is different from that between two photodiodes in the pixel PE1 or the pixel PE2.

As described above, among the photodiodes PD1 to PD4 formed on the main surface of the semiconductor substrate, the photodiodes PD1 and PD2 and the photodiodes PD3 and PD4 have therebetween a deviation in the formation position. The deviation occurs because the formation position of the photodiodes PD1 and PD2 and the formation position of the photodiodes PD3 and PD4 are defined by exposure using respective masks to be used in a step of forming a solid state image sensor. More specifically, the positions of the photodiodes PD1 and PD2 are defined by a pattern of a mask used for exposure of the first exposure region IG1, while the positions of the photodiodes PD3 and PD4 are defined by a pattern of another mask used for exposure of the second exposure region IG2.

In the solid state image sensor configuring the semiconductor device of the present embodiment, a semiconductor chip (mage sensor) has a considerably large area and this area is larger than that exposable through a single mask. The first exposure region IG1 and the second exposure region IG2 on the main surface of the semiconductor chip are therefore formed by divided exposure with two masks, respectively. In this case, when these two masks are used for respective exposure steps, these masks cannot easily be aligned correctly and there occurs a deviation in the formation position between the photodiodes PD1 and PD2 formed in the first exposure region IG1 and the photodiodes PD3 and PD4 formed in the second exposure region IG2.

A specific layout of a plurality of photodiodes deviated from each other in a formation position will hereinafter be described referring to FIG. 3, that is, an enlarged plan view.

As shown in FIG. 3, the pixels PE1 to PE3 each have one microlens ML and two photodiodes in a light receiving portion. In the pixel PE1, the microlens ML and the photodiodes PD1 and PD2 are arranged so as to overlap with each other in plan view. Similarly in the pixel PE2, the microlens ML and the photodiodes PD3 and PD4 overlap with each other in plan view. Similarly, in the pixel PE3, the microlens ML and the photodiodes PD2 and PD3 overlap with each other in plan view. In this drawing, the contour of the microlens ML is shown by a dotted line.

The pixel PE1 has, around the light receiving portion thereof, a plurality of peripheral transistors and a substrate contact portion (not shown) and the light receiving portion, peripheral transistors, and substrate contact portion are each, at the peripheral portion of the active region thereof, surrounded by an element isolation region EI. The term "peripheral transistors" as used herein means a reset transistor RST, an amplifier transistor AMI, and a selection transistor SEL.

The active region AR including the light receiving portion has almost a rectangular shape in plan view. In one of the pixels PE1, peripheral transistors are formed in one active region and this active region extends in the X-axis direction along one side of the active region AR of the light receiving portion. Although not shown here, an active region configuring the substrate contact portion, for example, extends in the Y-axis direction along the other side of the active region AR of the light receiving portion or, for example, is formed in land form in the vicinity of the active region AR.

The active region AR has, along the other side thereof opposite to the side where the peripheral transistors are, a transfer transistor TX1 having, as a source region, the photodiode PD1 of the active region AR and a transfer transistor TX2 having, as a source region, the photodiode PD2 of the active region AR. In other words, in the active region AR, the photodiodes PD1 and PD2 are juxtaposed in the X-axis direction and the transfer transistors TX1 and TX2 are juxtaposed in the X-axis direction while corresponding to the photodiodes PD1 and PD2, respectively.

The peripheral transistors each have a gate electrode GE extending in the Y-axis direction and the transfer transistors TX1 and TX2 each have a gate electrode GE extending in the X-axis direction. The gate electrodes GE are each made of, for example, polysilicon and are formed via a gate insulating film (not shown) on the semiconductor substrate.

In the active region having therein the peripheral transistors, the reset transistor RST, the amplifier transistor AMI, and the selection transistor SEL are juxtaposed successively in the X-axis direction. The reset transistor RST and the amplifier transistor AMI have a drain region in common. The source region of the reset transistor RST is coupled to the drain of the transfer transistors TX1 and TX2, that is, a floating diffusion (floating diffusion portion) FD. The source region of the amplifier transistor AMI functions as a drain region of the selection transistor SEL. The selection transistor SEL has a source region coupled to an output line OL as will be described later in FIG. 5.

As shown in FIG. 3, the respective drain regions of the transfer transistors TX1 and TX2, the source region of the selection transistor SEL, the source region of the reset transistor RST, and the drain region of the amplifier transistor AMI are N⁻ type semiconductor regions formed in the main surface of the semiconductor substrate and the substrate contact portion (not shown) is a P⁺ type semiconductor region formed in the main surface of the semiconductor substrate. These semiconductor regions have, on the upper surface thereof, contact plugs CP, respectively. Although not illustrated here, contact plugs are also on the upper surface of each of the gate electrodes GE.

The substrate contact portion is a region to which a ground potential GND (refer to FIG. 5) is to be applied. This portion plays a role of preventing variation in the threshold voltage of the peripheral transistors by fixing the potential of a well in the upper surface of the semiconductor substrate to 0 V.

The photodiodes PD1 and PD2 arranged in the X-axis direction in the active region AR which is a light receiving portion are each a semiconductor element extending in the Y-axis direction. This means that the longer direction of each of the photodiodes PD1 and PD2 extends along the Y-axis direction.

As will be described later referring to FIG. 4, the photodiode PD1 is comprised of an N⁻ type semiconductor region N1 formed in the main surface of the semiconductor substrate and a well region WL which is a P type semiconductor region. Similarly, the photodiode PD2 is comprised of an N⁻ type semiconductor region N2 formed in the main surface of the semiconductor substrate and the well region WL. The photodiodes PD1 and PD2 which are light receiving elements shown in FIG. 3 can be regarded as those formed in the formation regions of the N⁻ type semiconductor regions N1 and N2. A region, in the active region AR, other than the region having therein the N⁻ type semiconductor regions N1 and N2 is a P⁻ type well region WL.

The active region AR has almost a rectangular shape in plan view and one of four sides configuring the rectangle has two protrusions. One of the protrusions has a drain region (floating diffusion FD) of the transfer transistor TX1 and the other protrusion has drain region (floating diffusion FD) of the transfer transistor TX2. Gate electrodes GE straddle over these two protrusions, respectively.

These two protrusions are coupled to each other. This means that the active region AR has a closed layout including the rectangular pattern and two protrusion patterns protruding from one of the side of the rectangular pattern and coupled to each other. A region surrounded by the closed active region AR has therein an element isolation region EI similar to that outside the active region AR. The two protrusions are not necessarily coupled to each other on the main surface of the semiconductor substrate SB. In other words, the active region AR does not necessarily have a closed structure. In this case, the floating diffusions FD of the transfer transistors TX1 and TX2 are electrically coupled to each other via a contact plug or a wiring on the semiconductor substrate.

The pixel PE2 has a structure similar to that of the pixel PE1 which has been described above. Described specifically, the pixel PE2 has the photodiodes PD3 and PD4 juxtaposed in the X-axis direction in the active region AR that overlaps with the microlens ML in plan view. The active region AR has, in the vicinity thereof, peripheral transistors. The pixels PE1 and PE2 each have no level difference at the center of two sides of the active region AR parallel to the X-axis direction except for the above-described protrusions. This means that no deviation of the layout occurs in these pixels.

The pixel PE3 has a structure substantially similar to that of the pixel PE1 or PE2, but the rectangular active region AR of the pixel PE3 has, on one of four sides thereof having two protrusions, a level difference DP at the center between these two protrusions. Similarly, another level difference DP is on a side of the active region AR parallel to the above-described one side. These level differences DP on these two sides of the active region AR of the pixel PE3 is at a position overlapping with a predetermined line in plan view. This straight line is indicated by a two-dot chain line in FIG. 3. This also applies to other pixels PD3 arranged in the Y-axis direction (refer to FIG. 2).

This straight line is a boundary line (which may hereinafter be called "boundary line DL" simply) between regions exposed through two different masks during exposure of a photoresist film in a lithography step for forming the element isolation region EI and defining the active region AR. Although not indicated by a two-dot chain line, a boundary line between regions exposed through two respectively different masks is present also between the pixels PE1 and PE3 or the pixels PE3 and PE2. This means that the end portion of the second exposure region IG2 that overlaps with the first exposure region IG1 is a boundary between exposure regions. Similarly, the end portion of the first exposure region IG1 that overlaps with the second exposure region IG2 is a boundary between exposure regions.

A region of the third region 3A including the photodiode PD3 of the pixel PE3 is a region where the layout of each element is defined by a mask for exposing the second exposure region IG2, while a region of the third region 3A including the photodiode PD2 of the pixel PE3 is a region where the layout of each element is defined by a mask for exposing the first exposure region IG1.

This means that the photodiodes PD1 and PD2 of the pixel PE1 and the photodiode PD2 of the pixel PE3 are light receiving elements formed through a mask for exposing the first exposure region IG1 and the pixel PE1 and the photodiode PD2 of the pixel PE3 have therebetween a photodiode PD3 formed through a mask for exposing the second exposure region IG2. Similarly, the photodiodes PD3 and PD4 of the pixel PE2 and the photodiode PD3 of the pixel PE3 are light receiving elements formed through a mask for exposing the second exposure region IG2 and the pixel PE2 and the photodiode PD3 of the pixel PE3 have therebetween a photodiode PD2 formed through a mask for exposing the first exposure region IG1.

In the present application, such a state is called mixed arrangement of photodiodes formed by two masks (right and left masks) to be used for exposing the first exposure region IG1 and the second exposure region IG2, respectively.

In other words, in the third region 3A where the first exposure region IG1 overlaps with the second exposure region IG2, an element in a region on the side closer to the second region 2A with respect to the boundary line DL is formed through the mask for exposing the first exposure region IG1 and an element in a region on the side closer to the first region 1A with respect to the boundary line DL is formed through the mask for exposing the second exposure region IG2. The photodiodes PD1 and PD2 in the first region 1A and the third region 3A are therefore arranged in matrix form along the X-axis direction and the Y-axis direction, while the photodiodes PD3 and PD4 in the second region 2A and the third region 3A are arranged in matrix form along the X-axis direction and the Y-axis direction.

The photodiodes PD3 and PD4 are, on the other hand, at a position deviated from the photodiodes PD1 and PD2 in a specific one direction. In the present embodiment, since a plurality of photodiodes is formed by divided exposure in the pixel array portion of the solid state image sensor, formation position of some photodiodes is deviated from that of the other photodiodes. The distance between two photodiodes in each of the pixels PE1 and PE2 formed in the first region 1A and the second region 2A is constant, but it is different from the distance between the photodiodes PD2 and PD3 in the pixel PE3 in the third region 3A.

The boundary line DL overlaps with all the pixels PE3 of a specific column, but does not overlap with the pixels PE1 and PE2 of another column. The boundary line DL overlaps with the active region AR of each of the pixels PE3, but does not overlap with the photodiodes PD2 and PD3. This means that the deviation caused by divided exposure occurs at a position along the Y-axis direction between the photodiodes PD2 and PD3 of the pixel PE3.

The boundary line DL extends in the Y-axis direction, that is, in a longer direction of each of the photodiodes PD1 to PD4. In the vicinity of the active region AR of the pixel PE3, a level difference is present at a position which is in the active region having therein the peripheral transistors and lying between the amplifier transistor AMI and the selection transistor SEL and overlaps with the boundary line DL. No contact plug is coupled to the main surface of the semiconductor substrate configuring a drain region between the amplifier transistor AMI and the selection transistor SEL so that a coupling failure of the contact plug CP due to a level difference, if any, can be prevented.

The pixels PE1 and PE2 each have a configuration similar to that of the pixel PE3 except that the active region AR has no level difference DP, the peripheral transistors have, in the active region thereof, no level difference, and they do not overlap with the boundary line DL.

FIG. 4 is a cross-sectional view along the arrangement direction of the photodiodes PD3 and PD2 in one of the pixels PE3 (refer to FIG. 3). The cross-sectional view of FIG. 4 omits a boundary between interlayer insulating films stacked one after another over the semiconductor substrate SB. As shown in FIG. 4, the semiconductor substrate SB made of N type single crystal silicon or the like has, in the upper surface thereof, a $P^-$ type well region WL. The well region WL has thereover an active region AR and element isolation regions EI for separating it from another active region. The element isolation region EI is made of, for example, a silicon oxide film and it is buried in a trench formed in the upper surface of the semiconductor substrate SB.

The well region WL has, in the upper surface thereof, $N^-$ type semiconductor regions N1 and N2 sandwiched between the element isolation regions EI. The well region WL forming a PN junction with the $N^-$ type semiconductor region N1 functions as an anode of the photodiode PD3. The well region WL forming a PN junction with the $N^-$ type semiconductor region N2 functions as an anode of the photodiode PD2. The $N^-$ type semiconductor region N1 and the $N^-$ type semiconductor region N2 are provided in one active region AR sandwiched between the element isolation regions EI.

Thus, the active region AR formed in the pixel has the photodiode PD3 comprised of the $N^-$ type semiconductor region N1 and the well region WL and the photodiode PD2 comprised of the $N^-$ type semiconductor region N2 and the well region WL. In the active region AR, the photodiodes PD3 and PD2 are juxtaposed via a portion of the well region WL exposed from the upper surface of the semiconductor substrate SB. The well region WL on the upper surface of the semiconductor substrate SB between the photodiode PD3 and the photodiode PD2 overlaps with the boundary line DL shown in FIG. 3 in plan view. The formation positions of the $N^-$ type semiconductor regions N1 and N2 correspond to the formation positions of the photodiodes PD3 and PD2 shown in FIG. 3, respectively. This means that portions having therein the $N^-$ type semiconductor regions N1 and N2 function as a photoelectric conversion portion.

The formation depth of the $N^-$ type semiconductor region N1 or N2 is shallower than that of the well region WL. The depth of the trench in the upper surface of the semiconductor substrate SB having the element isolation region EI buried therein is shallower than the formation depth of the $N^-$ type semiconductor region N1 or N2.

The semiconductor substrate SB has thereon an interlayer insulating film IF that covers the element isolation region EI and the photodiodes PD3 and PD2 therewith. The interlayer insulating film IF is obtained by stacking a plurality of insulating films. The interlayer insulating film IF has therein a plurality of wiring layers stacked one after another and the lowermost wiring layer has therein a wiring M1 covered with the insulating film IF. The wiring M1 has thereon a wiring M2 via the interlayer insulating film IF and the wiring M2 has thereon a wiring M3 via the interlayer insulating film IF. The interlayer insulating film IF has, in the upper portion thereof, a color filter CF and the color filter CF has thereon the microlens ML. During operation of the solid state image sensor, light is irradiated to the photodiodes PD3 and PD2 via the microlens ML and the color filter CF.

The active region AR including the photodiodes PD3 and PD2 have, right thereabove, no wiring in order to prevent light incident from the microlens ML from being blocked by the wiring and not irradiated to the photodiodes PD3 and PD2 which are light receiving portions of a pixel. On the contrary, wirings M1 to M3 are placed in a region other than the active region AR to prevent photoelectric conversion from occurring in the active region having peripheral transistors and the like therein.

Not only formation of the active region AR and the element isolation region EI but also formation of the N⁻ type semiconductor regions N1 and N2, the gate electrode GE (refer to FIG. 3), the interlayer insulating film IF, and the wirings M1 to M3 is achieved by a plurality of times of exposure treatment using divided exposure. This exposure treatment is performed for respective exposure regions isolated by the boundary line DL. This means that in any step such as ion implantation step for forming the N⁻ type semiconductor regions N1 and N2 or a step of forming a contact hole to be filled with a contact plug, a dividing position in exposure treatment is set at a position overlapping with a region between the photodiode PD3 and the photodiode PD2 possessed by each of the pixels PE3 (refer to FIG. 3) arranged in a column in the Y-axis direction.

The planar layout of each of the N⁻ type semiconductor regions N1 and N2, the gate electrode GE, the contact hole, and the wirings M1 to M3 is therefore deviated in each of regions sandwiching therebetween the boundary line DL.

With regard to management of mask misalignment in respective steps of forming the N⁻ type semiconductor regions N1 and N2, the gate electrode GE, the contact hole, and the wirings M1 to M3, variations in the performance of the solid state image sensor can be reduced by managing only the misalignment due to an overlaying (overlapping) error at a dividing position of the active region in each step.

FIG. 3 shows the structure in which the photodiode PD2 and the gate electrode GE and the contact plug CP at the periphery thereof are formed at a position deviated from the photodiode PD3 in a direction similar to that of the layout of the active region AR by divided exposure. On the other hand, pattern formation of the active region AR and that of the photodiode PD2, the gate electrode GE, and the contact plug CP are performed by respective exposure steps using different masks so that these patterns are not always deviated at an equal deviation amount in the same direction. This means that patterns of the active region, semiconductor region, gate electrode, and wiring formed by different steps are not deviated in one direction due to mask misalignment but deviated in various directions with the vicinity of the boundary line DL as a boundary.

The reason why the solid state image sensor included in the semiconductor device of the present embodiment has two photoelectric conversion portions (for example, photodiodes) in one pixel is that when a digital camera having an image-plane phase-detection type autofocusing system uses the solid state image sensor of the present embodiment, the resulting digital camera can have improved focusing precision and focusing speed. Such a digital camera can achieve focusing in a short time based on a drive amount of the lens necessary for focusing determined from a signal deviation amount, that is, phase difference detected by one of the photodiodes in the pixel and the other photodiode respectively. By providing the pixel with a plurality of photodiodes, therefore, a larger number of minute photodiodes can be formed in the solid state image sensor. This leads to improvement in autofocusing precision.

When a photographed image is output, signals (charges) of two photodiodes in a pixel are output collectively as a single signal. This makes it possible to obtain an image comparable to that of a solid state image sensor equipped with a plurality of pixels having only one photodiode.

The present embodiment describes the structure using a P type well region as an anode and a diffusion layer which is an N⁻ type semiconductor region as a cathode. Not only it but also a solid state image sensor having a photodiode comprised of an N type well and a P⁻ type diffusion layer in the N type well or a photodiode having, on the surface thereof, a diffusion layer with a conductivity type equal to that of the pixel well can produce a similar advantage. In addition, the kind of the solid state image sensor is not limited to a CMOS image sensor and the above-described advantage can also be achieved by actualizing a structure similar to that of CCD (charge coupled device).

Figure 5:
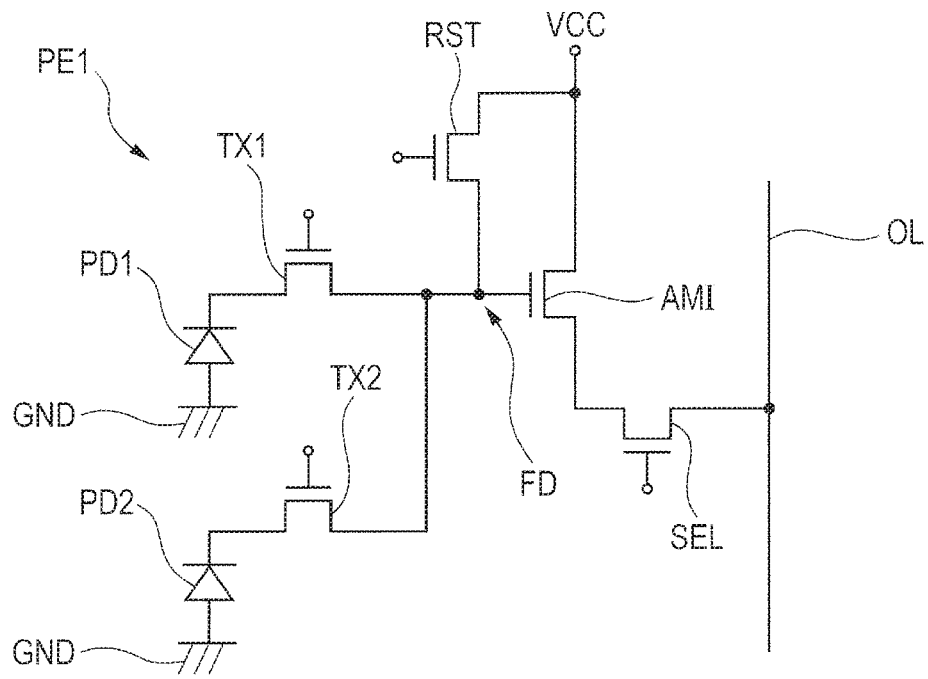
FIG. 5 is an equivalent circuit diagram showing the semiconductor device of First Embodiment of the invention.

Next, an equivalent circuit diagram of a pixel is shown in FIG. 5. A plurality of the pixels PE shown in FIG. 1 each has the circuit shown in FIG. 5. Here, the circuit and operation of the pixel PE1 (refer to FIG. 2) will be described as one example, but they equally apply to the circuit and operation of the pixel PE2 or PE3 (refer to FIG. 2).

As shown in FIG. 5, the pixel has photodiodes PD1 and PD2 at which photoelectric conversion is performed, a transfer transistor TX1 for transferring charges generated at the photodiode PD1, and a transfer transistor TX2 for transferring charges generated at the photodiode PD2. The pixel also has a floating diffusion (floating diffusion portion) FD for accumulating charges transferred from the transfer transistors TX1 and TX2 and an amplifier transistor AMI for amplifying the potential of the floating diffusion FD.

The pixel further has a selection transistor SEL for selecting whether or not the potential amplified by the amplifier transistor AMI is output to the output line OL coupled to one of the readout circuits CC1 and CC2 (refer to FIG. 1) and a reset transistor RST for initializing the potentials of the respective cathodes of the photodiodes PD1 and PD2 and the floating diffusion FD to predetermined ones. The transfer transistors TX1 and TX2, the reset transistor RST, the amplifier transistor AMI, and the selection transistor SEL are each, for example, an N type MOS transistor.

A ground potential GND which is a minus-side power supply potential is applied to the respective anodes of the photodiodes PD1 and PD2 and the cathodes of the photodiodes PD1 and PD2 are coupled to the sources of the transfer transistors TX1 and TX2, respectively. The floating diffusion FD is coupled to the respective drains of the transfer transistors TX1 and TX2, the source of the reset transistor RST, and the gate of the amplifier transistor AMI. To the drain of the resent transistor RST and the drain of the amplifier transistor AMI are applied a plus-side power supply potential VCC. The source of the amplifier transistor AMI is coupled to the drain of the selection transistor SEL. The source of the selection transistor SEL is coupled to the output line OL coupled to either one of the readout circuits CC1 and CC2.

Next, operation of the pixel will be described. When a predetermined potential is applied to the respective gate electrodes of the transfer transistors TX1 and TX2 and the reset transistor RST, the transfer transistors TX1 and TX2 and the reset transistor RST are all turned ON. Then, charges remaining in the photodiodes PD1 and PD2 and charges accumulated in the floating diffusion FD flow toward the plus-side power supply potential VCC to initialize the charges of the photodiodes PD1 and PD2 and the floating diffusion FD. The reset transistor RST is then turned OFF.

Next, an incident light is irradiated to the PN junction of the photodiodes PD1 and PD2 to cause electric conversion at the photodiodes PD1 and PD2. As a result, charges are generated at each of the photodiodes PD1 and PD2. These charges are all transferred to the floating diffusion FD by the transfer transistors TX1 and TX2. The floating diffusion FD accumulates the charges thus transferred. This changes the potential of the floating diffusion FD.

Next, when the selection transistor SEL is turned ON, the potential of the floating diffusion FD after change is amplified by the amplifier transistor AMI and then, output to the outline OL. One of the readout circuits CC1 and CC2 reads out the potential of the output line OL. When image plane phase detection type autofocusing is performed, charges of each of the photodiodes PD1 and PD2 are not simultaneously transferred to the floating diffusion FD by means of the transfer transistors TX1 and TX2 but they are successively transferred and readout. In such a manner, charges of each of the photodiodes PD1 and PD2 are read out. During image pickup, the charges of the photodiodes PD1 and PD2 are transferred simultaneously to the floating diffusion FD. This means that the output for a static image is determined by the sum of outputs of the active regions of two photodiodes in each pixel.

Figure 26:
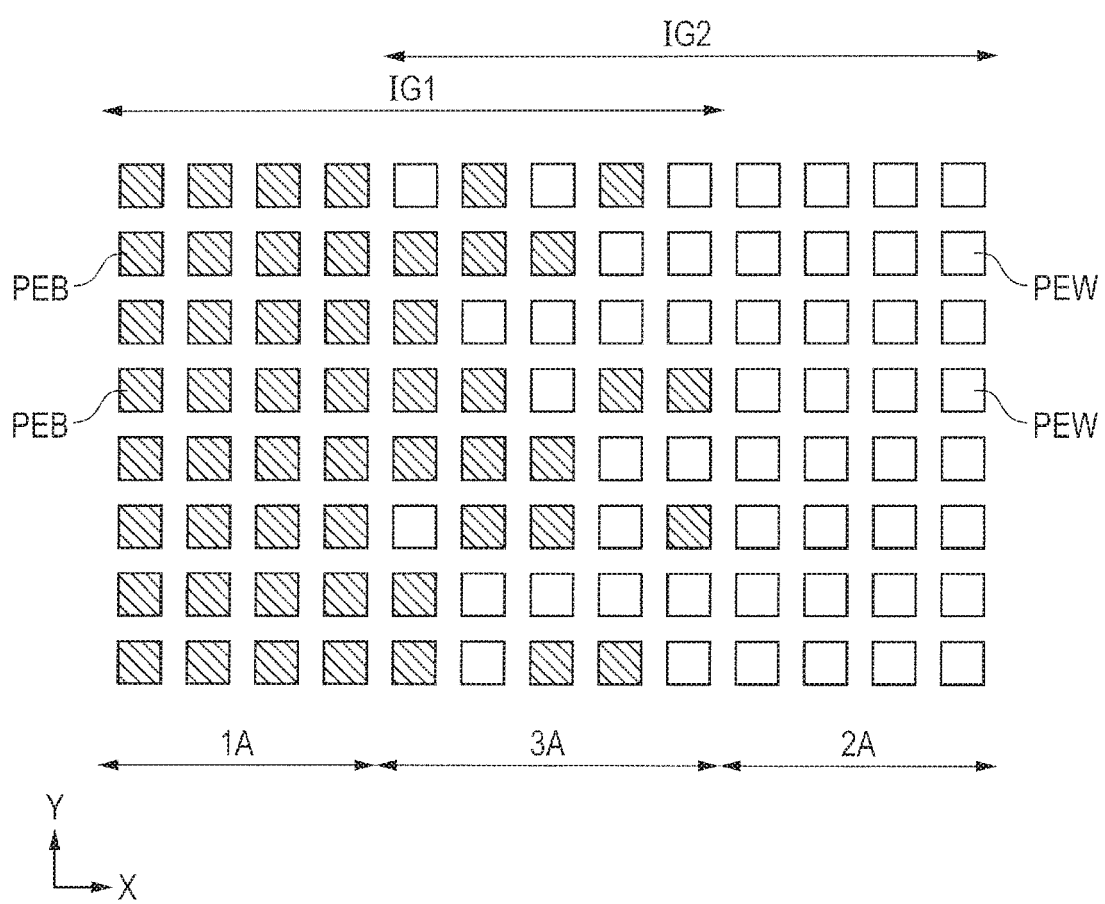
FIG. 26 is a planar layout showing a semiconductor device of Comparative Example.

The advantage of the semiconductor device of the present embodiment will next be described using Comparative Example shown in FIG. 26. FIG. 26 is a planar layout showing a pixel array portion of a solid state image sensor included in a semiconductor device of Comparative Example.

In order to form a solid state image sensor having a chip size exceeding the maximum exposure region of an exposure apparatus, it is necessary to carry out divided exposure for forming, in a region of a semiconductor wafer in which a single chip is formed, patterns by performing exposure a plurality of times while changing an exposure site. In this case, exposure treatment is performed using respectively different masks for a plurality of times of exposure so that there may occur size variations or overlaying errors due to the mask or exposure apparatus among the resist patterns formed through the plurality of masks even in lithography in the same step. A difference in an area or distance among the photodiodes formed through the plurality of masks may therefore occur and then, the resulting solid state image sensor may cause image abnormalities due to a difference in output value.

Described specifically, when divided exposure is performed through two masks, deviation in pattern formation position occurs between an exposure region exposed through one of the masks and an exposure region exposed through the other mask and this leads to a difference in light receiving characteristics of a pixel at the boundary between these exposure regions. This difference in characteristics of a pixel in the vicinity of the boundary is a visible abnormality of an image or picture obtained by imaging using a solid state image sensor and becomes a cause for a linear imaging abnormality at a position corresponding to the boundary. If such an abnormality occurs, an image obtained by imaging has a deteriorated quality.

At the time of performing image-plane phase-detection type autofocusing with two photodiodes provided in one pixel, an output difference occurs between these two photodiodes and as a result, an autofocusing detection error increases. This leads to an increase in time required for focusing. In addition to this problem, by providing an extra circuit for image correction, the resulting semiconductor device may have other problems such as increase in electric power consumption and delay in operation.

As shown in FIG. 26, in the semiconductor device of Comparative Example, by partially overlapping the exposure regions to be subjected to divided exposure, image abnormalities that occur at the boundary among the exposure regions are made inconspicuous. In FIG. 26, hatched pixels PEB are pixels exposed through a first mask and hatch-free pixels PEW are pixels exposed through a second mask different from the first mask.

In Comparative Example, similar to the layout shown in FIG. 2, a first exposure region IG1 has a first region 1A and a third region 3A and a second exposure region IG2 has a second region 2A and a third region 3A. In the third region 3A, the first exposure region IG1 and the second exposure region IG2 overlap with each other. In this example, in the third region 3A, the pixels PEB are arranged so that the number of them decreases gradually toward the side of the second region 2A and the pixels PEW are arranged so that the number of them decreases gradually toward the side of the first region 1A.

Thus, since at the boundary region of divided exposure, the respective pixels PEB and PEW of the first exposure region IG1 and the second exposure region IG2 to be exposed through two masks are mixedly placed, it becomes difficult to visibly recognize an output level difference in the vicinity of the boundary of divided exposure on an image and as a result, the image can have an improved quality in the boundary region.

In a solid state image sensor having, in a pixel thereof, two photodiodes below a microlens, a difference in output between these two photodiodes is presumed to lead to out of focus. When out of focus, image-plane phase-detection system autofocusing is performed by selecting photodiodes one by one from different pixels and searching the positions of two adjacent pixels equal in output of a plurality of the selected photodiodes. Based on an operation amount of the lens necessary for focusing thus determined, autofocusing can be achieved in a short time.

The semiconductor device of Comparative Example however has a problem. Described specifically, an output difference between the pixels PEB formed through a mask for the first exposure region IG1 and the pixels PEW formed through a mask for the second exposure region IG2 is increased due to deviation in finished size and overlapping position between right and left exposure regions and it may take longer time to find pixels having an equal output.

In addition, since among the pixels PEB and PEW arranged in matrix form, the number of pixels mixedly placed in one row differs perpendicularly (in the Y-axis direction), time for searching an output difference between pixels differs according to rows in the above-described image-plane phase-detection system autofocusing. In the vicinity of the boundary between exposure regions, therefore, the optimum focus correction amount becomes different according to rows. This considerably increases time necessary for focusing.

The semiconductor device of the present embodiment is similar to that of Comparative Example in that a semiconductor chip is formed by divided exposure and in that two divided exposure regions partially overlap with each other. The semiconductor device of the present embodiment is however different from that of Comparative Example in that as shown in FIG. 3, the first exposure region IG1 and the second exposure region IG2 overlap with each other only in a column of the pixels PE3 extending in the Y-axis direction. The semiconductor device of the present embodiment is a solid state image sensor having, in each pixel thereof, two photodiodes for image-plane phase-detection system autofocusing.

In the present embodiment different from Comparative Example, in the pixels PE3 in an overlapping region of exposure regions, the photodiodes PD2 formed through the mask for first exposure region IG1 are placed in a region separated from the first region 1A where the pixels PE1 formed through the mask for first exposure region IG1 are arranged but close to the side of the second region 2A where the pixels PE2 formed through the mask for second exposure region IG2 are arranged. Similarly, the photodiodes PD3 formed through the mask for second exposure region IG2 are placed in a region separated from the second region 2A where the pixels PE2 formed through the mask for second exposure region IG2 are arranged but close to the side of the first region 1A where the pixels PE1 formed through the mask for first exposure region IG1 are arranged.

This means that when divided exposure of a solid state image sensor is performed by dividing it into the first exposure region IG1 and the second exposure region IG2 that partially overlap with each other, inserted between photodiodes of the endmost column in matrix-form pixels formed through a mask for one of the exposure regions and photodiodes of a column adjacent thereto are photodiodes of a column formed through a mask for the other exposure region. Two photodiodes PD2 and PD3 in the pixels PE3 are therefore formed through respectively different masks. This equally applies not only to photodiodes in the pixel PE3 but also an active region, peripheral transistors, and wirings near these photodiodes (refer to FIGS. 3 and 4).

With regard to a column of the pixels PE3 at the boundary portion, two photodiodes PD2 and PD3 are mixedly placed in the pixels PE3 in the third region 3A so that relative positions with the microlens ML become same. The term "mixedly placed" as used herein means that patterns of an element and the like formed through a mask for one of the exposure regions are placed in a region where an element and the like to be formed through a mask for the other exposure region have been formed.

One of the advantages of the present embodiment is to make it difficult to recognize, on an image, a level difference of a static image output at the boundary portion between the first exposure region IG1 and the second exposure region IG2. The image available from the resulting solid state image sensor can have an improved quality and therefore, the semiconductor device can have improved performance.

An output for a static image is determined from an output sum of the active regions of two photodiodes in each pixel, but in the present embodiment, photodiodes formed through two masks, respectively, are mixedly placed in the pixel PE3.

It is presumed that in a solid state image sensor where divided exposure is performed, there appears a difference in formation position and output characteristics between the photodiodes PD1 and PD2 in the first exposure region IG1 and between the photodiodes PD3 and PD4 in the second exposure region IG2, in the pixels formed in the pixel array portion. In the present embodiment, however, the pixel PE3 has therein the photodiodes PD2 and PD3 formed through respectively different masks so that the output sum of these two photodiodes PD2 and PD3 of the pixel PE3 approximates the output sum of the photodiodes PD1 and PD2 of the pixel PE1 and at the same time approximates the output sum of the photodiodes PD3 and PD4 of the pixel PE2.

This makes it possible to prevent appearance of a marked difference in output characteristics of pixels between the first exposure region IG1 and the second exposure region IG2 at the boundary portion; and therefore makes it difficult to recognize, on an image, a level difference in static image output at the boundary portion between the first exposure region IG1 and the second exposure region IG2.

When the photodiodes PD2 and PD3 are formed through respectively different masks in the pixel PE3, one of the photodiodes in the pixel PE3 may functionally stop due to misalignment of the masks or the like. When the other photodiode functions in the pixel PE3, however, the output of it approximates an average output of the photodiodes PD1 and PD2 in the pixel PE1 and also approximates an average output of the photodiodes PD3 and PD4 in the pixel PE2. As a result, on an image available by imaging, an output difference due to divided exposure cannot be recognized easily at a corresponding position between the first region 1A and the third region 3A and between the third region 3A and the second region 2A.

Another advantage of the present embodiment is to reduce, in an image-plane phase-detection system autofocusing operation, a calculation time by simplifying the determination treatment in detecting a correction amount in the vicinity of the boundary portion. This makes it possible to increase the autofocusing speed so that the semiconductor device thus obtained can have improved performance.

Described specifically, in the calculation of a focusing correction amount in an image-plane phase-detection system autofocusing, the first exposure region IG1 and the second exposure region IG2 are formed under predetermined exposure conditions, respectively in the first region 1A and the second region 2A other than the boundary portion of divided exposure so that the image-plane phase-detection system autofocusing can be achieved using a pixel having two photodiodes and focusing position information can be calculated in a short time.

On the other hand, two photodiodes PD2 and PD3 formed through respectively different masks are placed in the pixel PE3 at the boundary portion so that there may occur a difference in the finished size of the active region in the pixel PE3 due to process variations under exposure conditions through these masks. In this case, even after focusing during imaging, it may be judged that unfocusing, that is, out-of-focus, occurs in the pixel PE3. The pixel judged as described above is only a column in the third region 3A in the pixel array portion in the present embodiment so that it has less influence on the image-plane phase-detection system autofocusing treatment in moving image and the focusing information can be calculated in a short time by using pixel columns adjacent thereto.

This means that at a position adjacent, in the X-axis direction, to the pixel PE3 of the third region 3A, a pixel having two photodiodes formed through the same mask under the same exposure conditions is present so that even in an image phase difference-system autofocusing position detection algorithm for searching until the outputs of the photodiodes on one side agree, searching can be completed in a short time. In short, information on a focusing position can be calculated in a short time.

In the present embodiment, the pixels PE3 are juxtaposed in the Y-axis direction. This means that the number of the pixels PE3 arranged in each row does not vary. It is therefore possible to prevent variations, for each row, in searching time of an output difference between pixels in the image-plane phase-detection system autofocusing which will otherwise occur due to difference in the number of pixels mixedly placed in every perpendicularly placed row (Y-axis direction) as in Comparative Example. Time necessary for focusing can therefore be shortened.

Here, a column of pixels including two photodiodes formed through respectively different masks is arranged in the Y-axis direction. Even without arranging the pixels in such a vertical straight line, almost similar function can be obtained by stepwise arrangement or zigzag arrangement in plan view. In principle, however, pixels arranged in a perpendicularly straight line are more effective for shortening the focusing position calculation time.

An advantage similar to that described above can be produced not only by applying the present embodiment to a solid state image sensor for detecting light irradiated from the main surface side of a semiconductor substrate but also by applying it to a back illuminated type solid state image sensor for detecting light irradiated from the back side of a semiconductor substrate. The above description essentially relates only to the arrangement of pixel layout. It is needless to say that with regard to the layer information of the pixel layout that determines the arrangement position, the pixels can be placed as the present embodiment by selecting a specific layer or some layers for all the layers and all the steps, for example, an element isolation step, a gate electrode formation step, an implantation step for source-drain regions, an implantation step of photodiode, and a wiring step.

Next, a method of manufacturing a solid state image sensor included a semiconductor device of the present embodiment will be described referring to FIGS. 6 to 9. FIGS. 6 to 9 are plan views of the semiconductor device of the present embodiment during manufacturing steps thereof. A method of manufacturing a pixel will hereinafter be described mainly.

Figure 6:
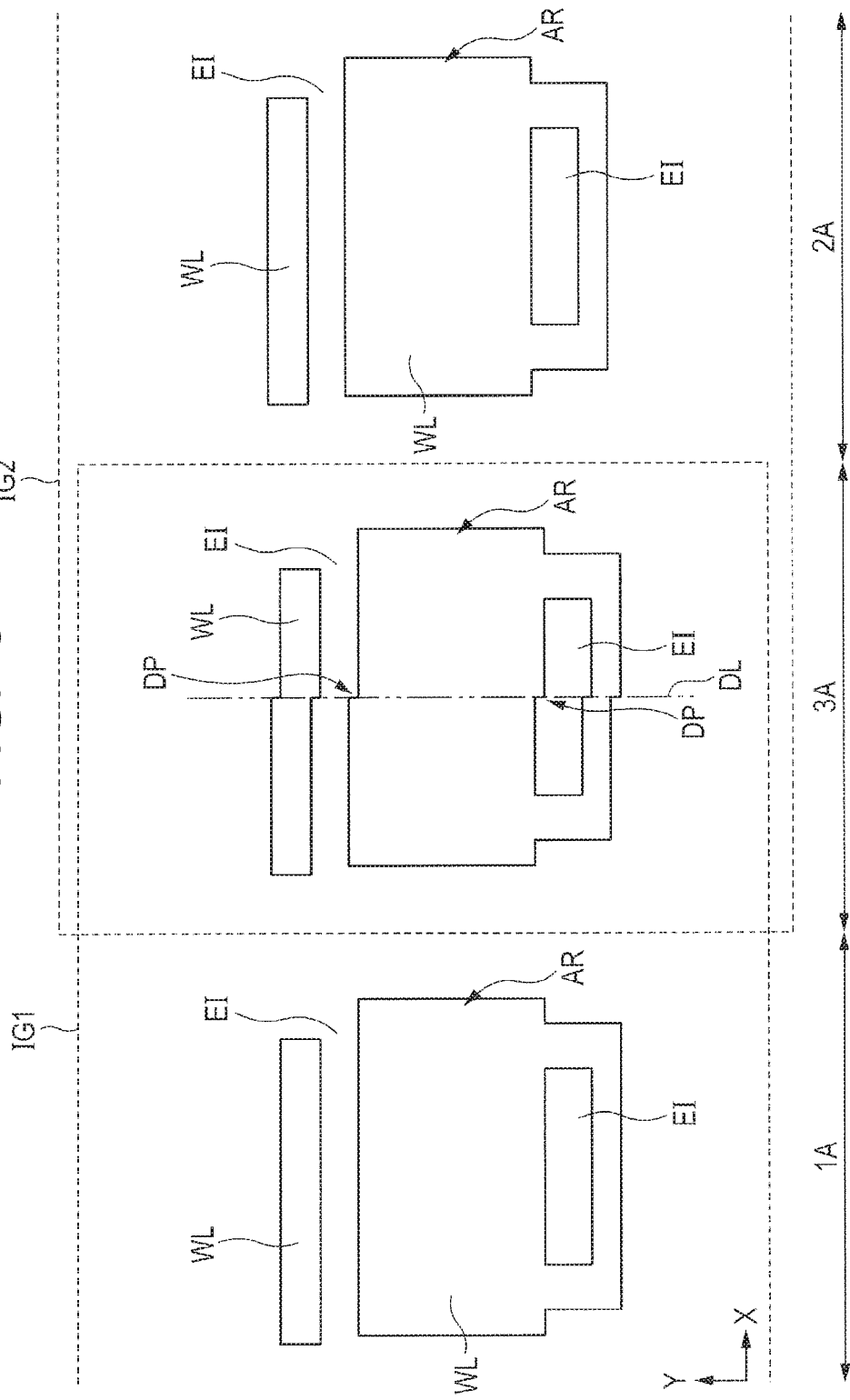
FIG. 6 is a plan view for describing a manufacturing step of the semiconductor device of First Embodiment of the invention.

First, as shown in FIG. 6, a semiconductor substrate SB including a plurality of regions which will be a semiconductor chip is provided. Next, a P type impurity (for example, B (boron)) is implanted into the main surface of the semiconductor substrate SB by ion implantation or the like to form a well region WL in the main surface of the semiconductor substrate SB.

Next, an element isolation region EI is formed on the well region WL by photolithography to separate the upper surface of the semiconductor substrate into active regions AR configuring pixels, respectively, in a pixel array portion. At this time, also active regions in a region in which readout circuits CC1 and CC2, an output circuit OC (refer to FIG. 1) and the like outside the pixel array portion are defined in the main surface of the semiconductor substrate. Here, the element isolation region EI made of a silicon oxide film is formed by STI (shallow trench isolation) system. Alternatively, the element isolation region EI may be formed by LOCOS (local oxidation of silicon) system.

For the formation of the element isolation region EI, first a protecting film (not shown) having a stacked structure of a silicon oxide film and a silicon nitride film is formed on the semiconductor substrate SB. Then, a photoresist film (not shown) is formed on the protecting film. The photoresist film is then exposed through two photomasks having a predetermined mask pattern. At this time, the photoresist film is exposed by divided exposure.

The term "divided exposure" as used herein means not exposure of the first exposure region IG1 and the second exposure region IG2 juxtaposed on the surface of the semiconductor substrate SB by single exposure treatment but exposure of the entire region which will be a semiconductor chip by exposing each of these two regions once, that is, twice exposure in total. In the description of the present embodiment, the entire region which will be a single semiconductor chip, in a semiconductor wafer, is divided into two exposure regions and exposure is performed twice. The exposure frequency and the number of exposure regions thus divided for exposing the entire region which will be a single semiconductor chip may be three or more.

When divided exposure of a photoresist film is performed, the first exposure region IG1 is exposed first through a first mask to transfer a mask pattern and then, the second exposure region IG2 is exposed through a second mask to transfer a mask pattern. At this time, the first exposure region IG1 and the second exposure region IG2 overlap with each other in the third region 3A. Then, the photoresist film after exposure is developed to pattern the photoresist film.

With the photoresist film as a mask, the protecting film exposed from the photoresist film is removed by etching. Then, the photoresist film used as an etching mask is removed. By dry etching with the protecting film as a mask, a trench for element isolation is formed in the main surface of the semiconductor substrate SB exposed from the protecting film. The trench is then filled with a silicon oxide film, followed by removal of the silicon oxide film and protecting film on the semiconductor substrate SB by polishing or the like to form an element isolation region EI partitioning a plurality of active regions including an active region AR. This means that from a region not covered with the element isolation region EI but covered with the protecting film, the main surface of the semiconductor substrate SB which is an active region is exposed.

FIG. 6 shows three regions arranged in the X-axis direction and in these regions, pixels are to be formed. A region to be a pixel has an active region AR which will be a light receiving portion and the other active region for peripheral transistors formed around the active region AR. The active region AR is a region in which two photodiodes are to be formed in a later step.

The pattern of an active region formed through a mask for exposing the first exposure region IG1 is deviated in one direction from the pattern of an active region formed through a mask for exposing the second exposure region IG2. This occurs due to misalignment at the time of placing masks to be used for divided exposure.

The misalignment between these active regions occurs between a region, in an active region AR of the third region 3A, in which one photodiode is to be formed and a region, in the active region AR, in which the other photodiode is to be formed. Due to this misalignment, a level difference DP is formed at the X-axis direction center of each of two sides of the active region AR of the third region 3A.

In addition, misalignment between the active regions occurs between a portion of the first exposure region IG1 that does not overlap with the second exposure region IG2, that is, the first region 1A and a portion, of the active region AR of the third region 3A in which two photodiodes are to be formed, closer to the side of the first region 1A. Similarly, misalignment between the active regions occurs between a portion of the second exposure region IG2 that does not overlap with the first exposure region IG1, that is, the second region 2A, and a portion, of the active region AR of the third region 3A in which two photodiodes are to be formed, closer to the side of the second region 2A.

No misalignment occurs between the first region 1A and a portion, of the active region AR of the third region 3A in which two photodiodes are to be formed, closer to the side of the second region 2A, because the patterns of these regions are formed through a first mask used for exposure of the first exposure region IG1. Similarly, no misalignment occurs between the second region 2A and a portion, of the active region AR of the third region 3A in which two photodiodes are to be formed, closer to the side of the first region 1A, because the patterns of these regions are formed through a second mask used for exposure of the second exposure region IG2.

Figure 7:
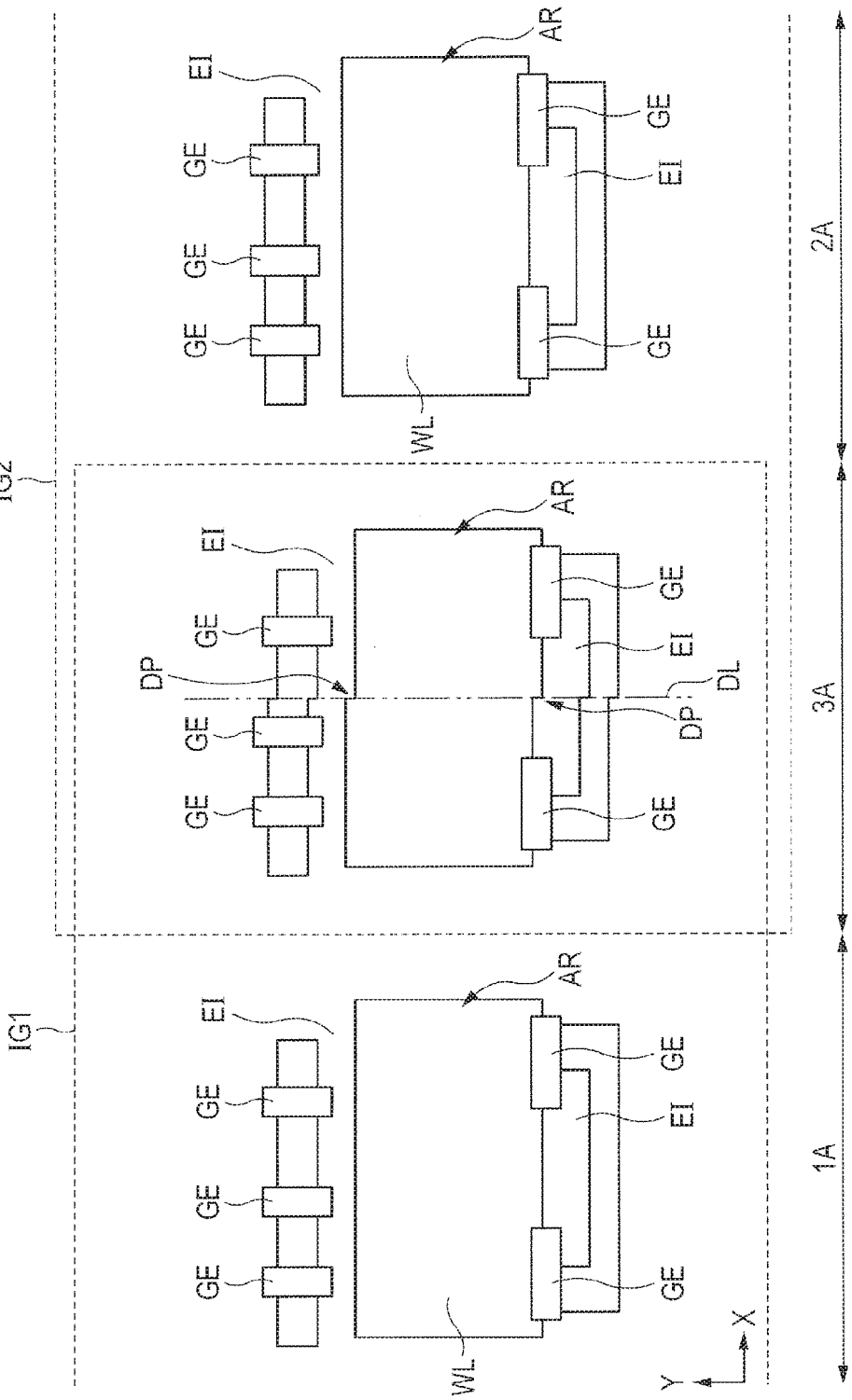
FIG. 7 is a plan view for describing a manufacturing step of the semiconductor device following that of FIG. 6.

Next, as shown in FIG. 7, a gate electrode GE is formed via a gate insulating film (not shown) on respective active regions where various MOS transistors such as transfer transistor, reset transistor, amplifier transistor, and selection transistor are formed. More specifically, after stacking an insulating film and a polysilicon film on the semiconductor substrate SB by CVD (chemical vapor deposition) or the like, the polysilicon film and the insulating film are patterned by etching using photolithography to form the gate insulating film made of the insulating film and the gate electrode GE made of the polysilicon film.

A plurality of the gate electrodes and the gate insulating films therebelow has a rectangular pattern extending in the Y axis direction in plan view and is formed on a predetermined active region. The gate electrode GE of the transfer transistor adjacent to the active region AR is formed right above a semiconductor region protruding from the active region AR in the Y-axis direction. In the present embodiment, two photodiodes are formed for each pixel and two transfer transistors corresponding to these photodiodes are formed so that there are two protrusions and two gate electrodes GE for the transfer transistor. The two protrusions configuring a portion of the active region AR are coupled to each other at a place to which they extend. Two transfer transistors in one pixel may have one gate electrode GE in common.

The reset transistor, the amplifier transistor, and the selection transistor which are peripheral transistors are juxtaposed on the other active region adjacent to the active region AR serving as a light receiving portion in a region of one pixel. Three gate electrodes GE of these peripheral transistors are therefore formed so as to straddle over the other active region. These three gate electrodes GE are juxtaposed in the X-axis direction right above the other active region extending in the X-axis direction.

When the polysilicon film and the insulating film are patterned in the step of forming the gate electrode GE, divided exposure treatment is performed as in the above step of forming the element isolation region EI to define the active region AR. Misalignment in formation position therefore occurs between the gate electrode GE formed through the mask for first exposure region IG1 and the gate electrode GE formed through the mask for second exposure region IG2.

Figure 8:
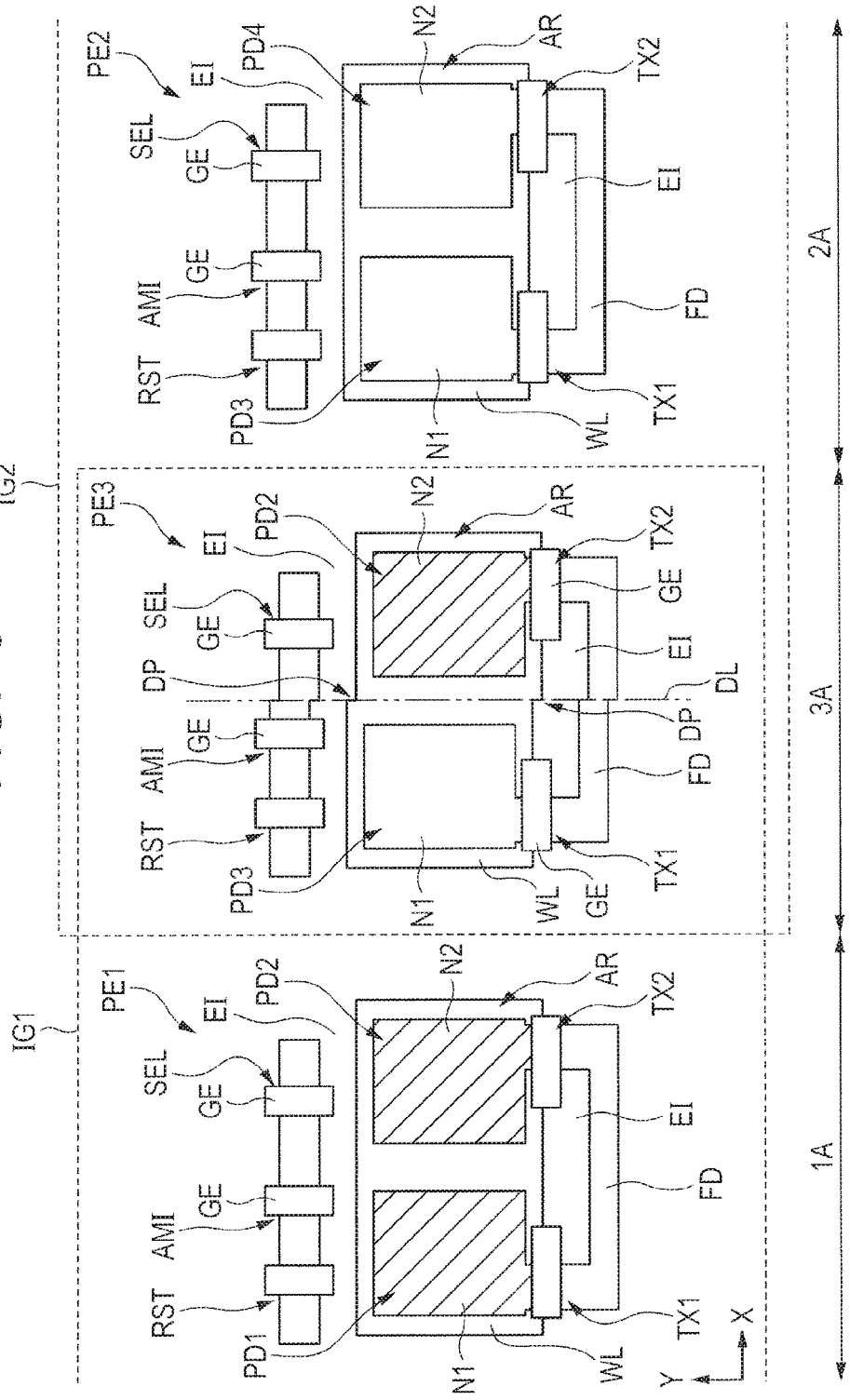
FIG. 8 is a plan view for describing a manufacturing step of the semiconductor device following that of FIG. 7.

Next, as shown in FIG. 8, various ion implantation steps are performed. By these steps, N$^-$ type semiconductor regions N1 and N2 and a drain region of the transfer transistors are formed in the upper surface of the well region WL in each active region AR; and source-drain regions of each peripheral transistor are formed in the other active region. The N$^-$ type semiconductor regions N1 and N2 are formed by implanting and introducing an N type impurity (for example, P (phosphorus) or As (arsenic)) into the main surface of the semiconductor substrate SB.

By the above ion implantation, in the active region AR of the first region 1A, a photodiode PD1 comprised of the N$^-$ type semiconductor region N1 and the well region WL and a photodiode PD2 comprised of the N$^-$ type semiconductor region N2 and the well region WL are formed. In addition, in the active region AR of the second region 2A, a photodiode PD3 comprised of the N$^-$ type semiconductor region N1 and the well region WL and a photodiode PD4 comprised of the N$^-$ type semiconductor region N2 and the well region WL are formed. Further, in the active region AR of the third region 3A, a photodiode PD3 comprised of the N$^-$ type semiconductor region N1 and the well region WL and a photodiode PD2 comprised of the N$^-$ type semiconductor region N2 and the well region WL are formed.

In each active region AR, transfer transistors TX1 and TX2 each comprised of the gate electrode GE and source-drain regions on both sides of the gate electrode GE are formed by the above ion implantation. In the other active region, a reset transistor RST, an amplifier transistor AMI, and a selection transistor SEL each comprised of the gate electrode GE and the source-drain regions on both sides of the gate electrode GE are formed.

As a result, a pixel PE1 including the photodiodes PD1 and PD2 and the peripheral transistors is formed in the first region 1A. A pixel PE2 including the photodiodes PD3 and PD4 and the peripheral transistors is formed in the second region 2A. A pixel PE3 including the photodiodes PD3 and PD2 and the peripheral transistors is formed in the third region 3A.

In the pixel PE1, the transfer transistor TX1 adjacent to the photodiode PD1 is formed in the active region AR of the first region 1A and the transfer transistor TX2 is formed adjacent to the photodiode PD2 in the active region AR of the first region 1A. In the pixel PE2, the transfer transistor TX1 adjacent to the photodiode PD3 is formed in the active region AR of the second region 1A and the transfer transistor TX2 adjacent to the photodiode PD4 is formed in the active region AR of the second region 2A. In the pixel PE3, the transfer transistor TX1 adjacent to the photodiode PD3 is formed in the active region AR of the third region 3A and the transfer transistor TX2 adjacent to the photodiode PD2 is formed in the active region AR of the third region 3A.

In the step of forming the above-described various semiconductor regions, ion implantation is performed with a photoresist film (not shown) as a mask. During formation of a pattern of this photoresist film, divided exposure treatment is performed as in the above-described step of forming the element isolation region EI. The boundary for divided exposure treatment is defined at the same position as that in the step of forming the active region AR. Misalignment in the formation position therefore occurs between the N$^-$ type semiconductor region N1 formed in the first region 1A and the N$^-$ type semiconductor region N1 formed in the second region 2A, with the boundary line DL as a boundary. Misalignment in the formation position also occurs between the N$^-$ type semiconductor region N1 formed in the third region 3A and the N$^-$ type semiconductor region N2 formed in the third region 3A, with the boundary line DL as a boundary.

Figure 9:
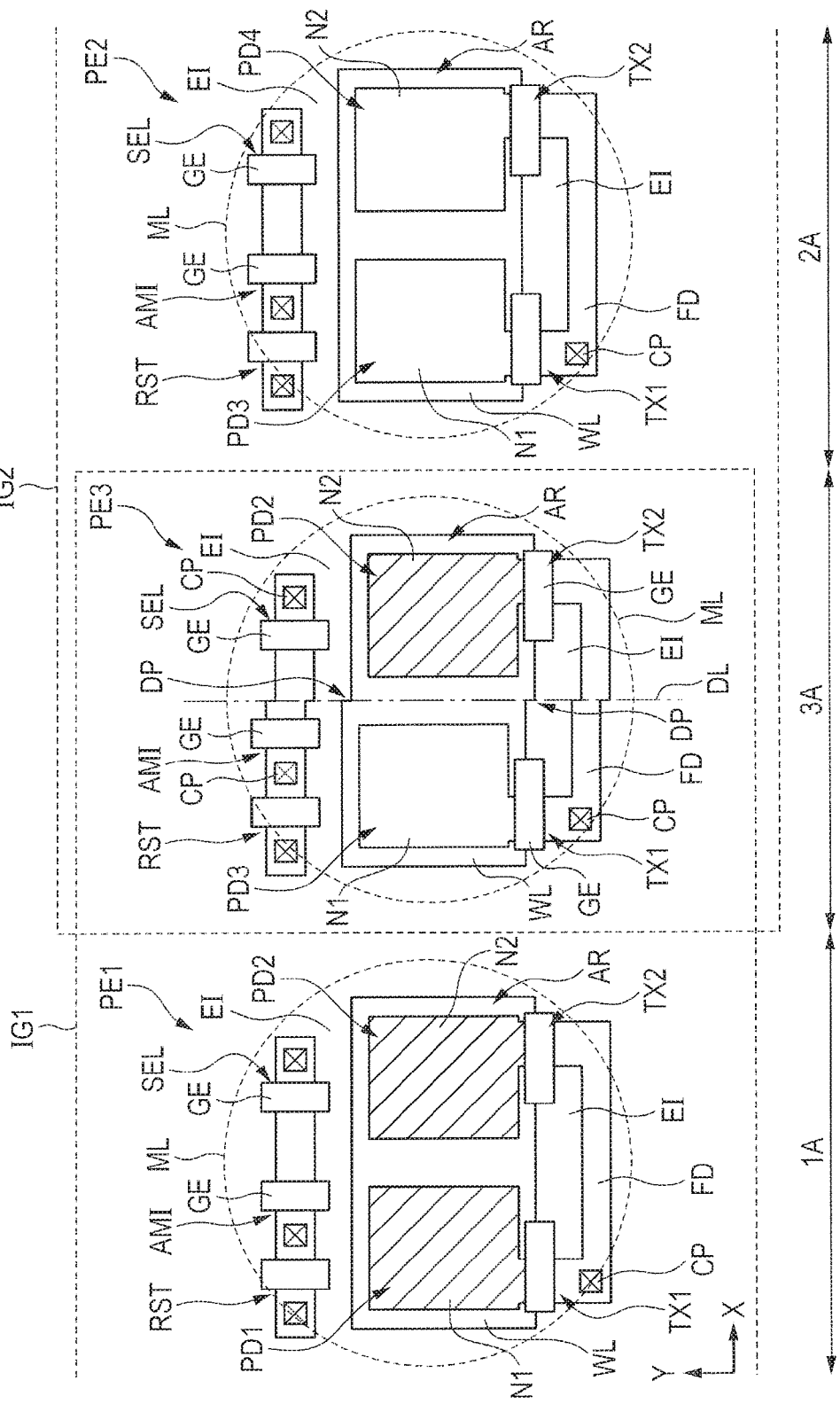
FIG. 9 is a plan view for describing a manufacturing step of the semiconductor device following that of FIG. 8.

Next, as shown in FIG. 9, after formation of an interlayer insulating film (not shown) on the semiconductor substrate SB, a contact plug CP penetrating the interlayer insulating film is formed.

Wirings M1 to M3 (refer to FIG. 4) are then formed. More specifically, after formation of a first-layer interlayer insulating film on the semiconductor substrate SB, a plurality of contact plugs CP penetrating the interlayer insulating film is formed. A lower wiring M1 coupled to the contact plug CP is then formed on the first-layer interlayer insulating film. After formation of a second-layer interlayer insulating film on the first-layer interlayer insulating film, a via plug penetrating the second-layer interlayer insulating film and a wiring M2 on the via plug are formed. By a similar step, a third-layer interlayer insulating film, a via plug, a wiring M3, and a fourth-layer interlayer insulating film are formed on the wiring M2 to complete formation of upper wirings. The stacked films comprised of the first to fourth interlayer insulating films configure an interlayer insulating film IF.

As a result, a solid state image sensor included in the semiconductor device of the present embodiment is completed. As shown in FIG. 4, a color filter CF and a microlens ML may be formed successively on the interlayer insulating film IF.

In the step of forming the interlayer insulating film IF, the contact plug CP, the via plug, and the wirings M1 to M3, patterning is performed by etching using a photoresist film (not shown) as a mask. When the pattern of this photoresist film is formed, divided exposure treatment is performed as in the step of forming the element isolation region EI. The boundary for divided exposure treatment is defined at the same position as that used in the step of forming the active region AR shown in FIG. 6.

The method of manufacturing a semiconductor device according to the present embodiment can produce an advantage similar to that produced by the semiconductor device of the embodiment described using Comparative Example of FIG. 26. When a solid state image sensor is formed by subjecting the first exposure regions IG1 and the second exposure region IG2 that partially overlap with each other in the third region 3A to divided exposure, two photodiodes PD2 and PD3 in the pixel PE3 of the third region 3A are formed through respectively different masks.

At this time, the photodiode PD2 formed through a first mask is placed, in the pixel PE3, not on the side of the first region 1A including the pixel PE1 formed through the first mask but on the side of the second region 2A including the pixel PE2 formed through a second mask. Similarly, the photodiode PD3 formed through a second mask is, in the pixel PE3, not on the side of the second region 2A including the pixel PE2 formed through the second mask but on the side of the first region 1A including the pixel PE1 formed through the first mask. This means that in the pixel PE3, the photodiodes PD2 and PD3 formed through the respective masks are mixedly placed.

This makes it difficult to recognize, on an image, a level difference in static image output at the boundary between the first exposure region IG1 and the second exposure region IG2. An image available by the solid state image sensor can have an improved quality and as a result, the semiconductor device can have improved performance.

Even when one of the photodiodes in the pixel PE3 does not function due to misalignment of a mask or the like, if the other photodiode in the pixel PE3 functions, the output approximates the average output of the photodiodes PD1 and PD2 in the pixel PE1 and approximates the average output of the photodiodes PD3 and PD4 in the pixel PE2. As a result, an output difference due to divided exposure at a corresponding position between the first region 1A and the third region 3A or between the third region 3A and the second region 2A cannot easily be recognized from an image obtained by imaging.

The manufacturing method of the present embodiment can reduce a calculation time in an image-plane phase-detection system autofocusing operation of the solid state image sensor thus manufactured by simplifying the determination treatment in detecting a correction amount in the vicinity of the boundary portion. This leads to an increase in autofocusing speed and as a result, the semiconductor device thus obtained can have improved performance.

Modification Example 1

Figure 10:
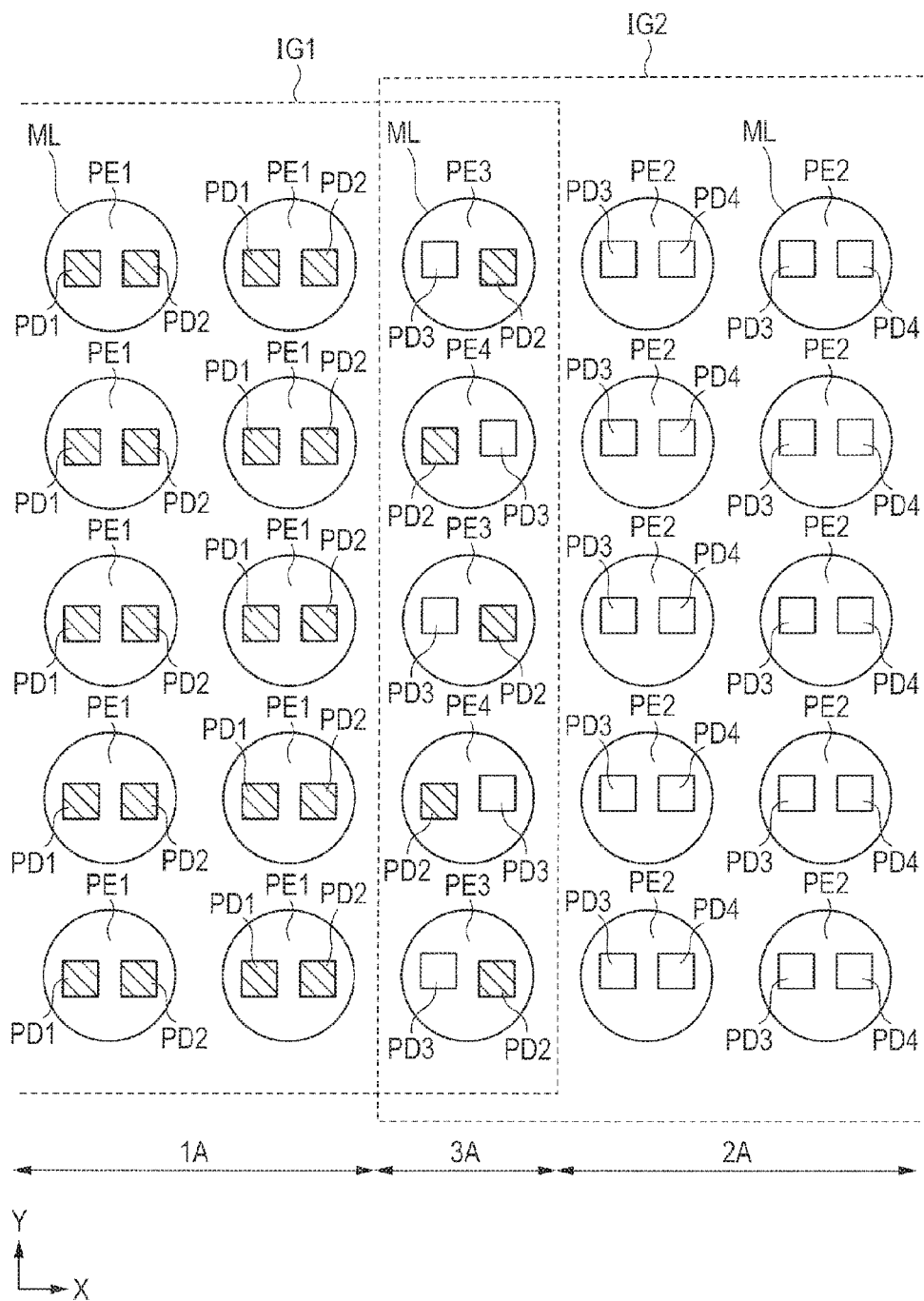
FIG. 10 is a planar layout showing a semiconductor device of Modification Example 1 of First Embodiment of the invention.

Modification Example of the present embodiment will next be described referring to FIG. 10. FIG. 10 is a planar layout showing a semiconductor device of Modification Example 1 of the present embodiment.

The present modification example is different from the layout described referring to FIG. 2 in that the third region 3A has therein a pixel PE4 and in the pixel PE4, photodiodes PD2 and PD3 are arranged without being mixedly placed. This means that in the third region 3A, the pixel PE4 and the pixel PE3 having a similar structure to that of FIG. 2 are arranged alternately in the Y-axis direction. In the pixel PE4, the photodiode PD2 formed through the mask for first exposure region IG1 is placed on the side of the first region 1A having the pixel PE1 formed through the mask for first exposure region IG1. In addition, in the pixel PE4, the photodiode PD3 formed through the mask for second exposure region IG2 is placed on the side of the second region 2A having the pixel PE2 formed through the mask for second exposure region IG2.

In the third region 3A, therefore, two columns in which photodiodes PD2 and PD3 formed through respectively different masks are alternately arranged a plurality of times in the Y-axis direction are juxtaposed in the X-axis direction.

Such arrangement and configuration enable an output difference between two photodiodes due to horizontal asymmetry of the microlens ML to average in the Y-axis direction (column direction). The present modification example therefore can produce, in addition to the advantage described referring to FIGS. 1 to 9, an advantage of making inconspicuous an output level difference between the first exposure region IG1 and the second exposure region IG2 in the X-axis direction (row direction).

More specifically, in image-plane phase-detection system focusing detection, when a microlens on the solid state image sensor is not symmetric, there occurs an output difference between two photodiodes in a pixel. It is however very difficult to obtain a completely symmetric microlens due to a problem in its manufacture and an output difference, though very small, appears between photodiodes.

In the present modification example, the positions of the photodiodes PD2 and PD3 are changed between the pixels PE3 and PE4 adjacent to each other in the Y-axis direction to average the output information between the pixels PE3 and PE4. This makes it possible to prevent generation of the output difference and thereby reduce an output level difference on an image available by imaging.

Figure 11:
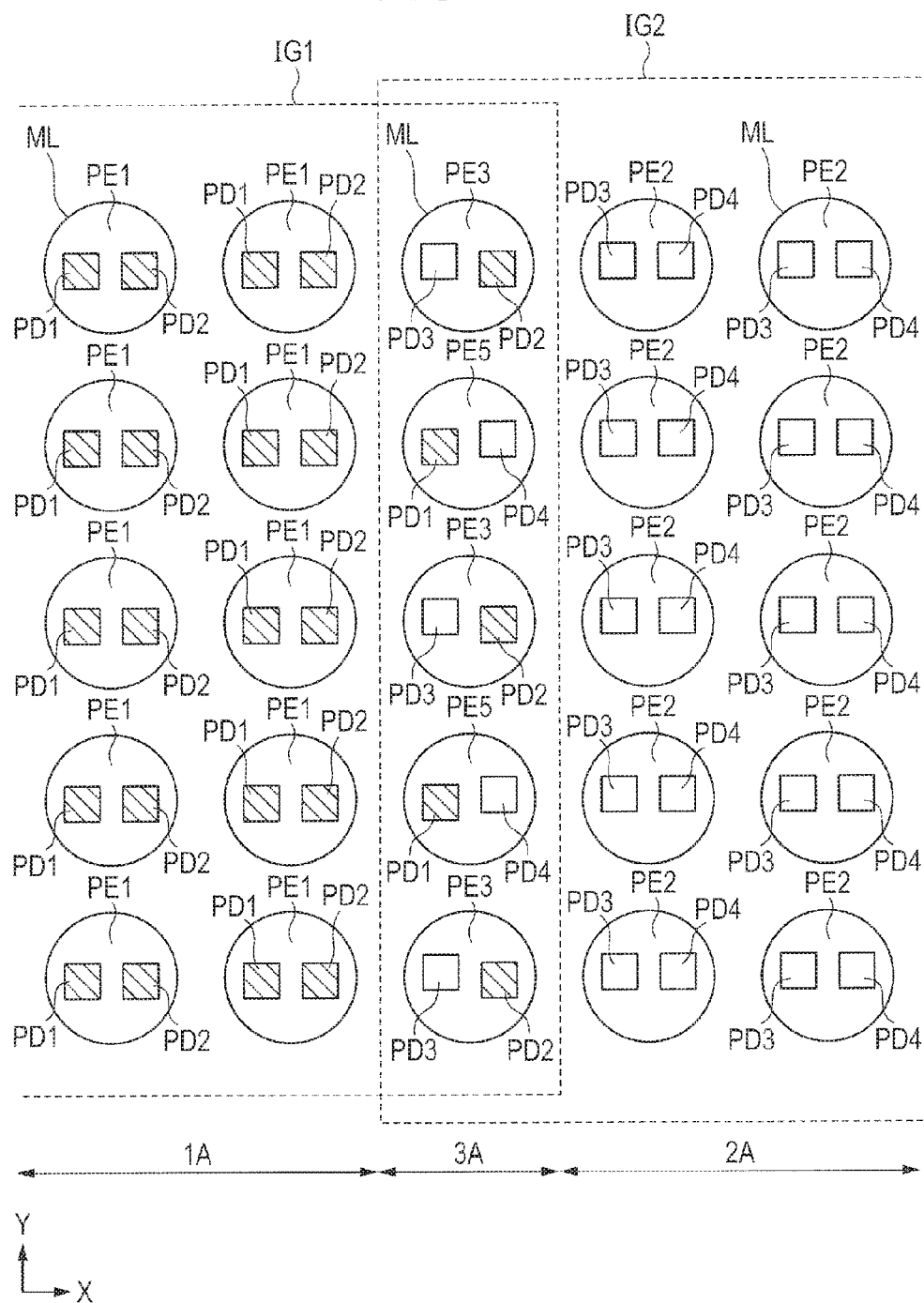
FIG. 11 is a planar layout showing another semiconductor device of Modification Example 1 of First Embodiment of the invention.

An advantage similar to that obtained by the solid state image sensor shown in FIG. 10 can be obtained even by alternately placing pixels PE3 and PE5 in the Y-axis direction in the third region 3A and placing photodiodes PD1 and PD4 in the pixel PE5 as shown in FIG. 11. In other words, in the pixel PE5, the photodiode PD1 is placed on a side closer to the first region 1A and the photodiode PD4 is placed on a side closer to the second region 2A. FIG. 11 is a planar layout showing another semiconductor device of Modification Example 1 of the present embodiment.

The photodiode PD1 in the pixel PE5 is, similar to the photodiodes PD1 and PD2 in the pixel PE1, a light receiving element formed through the mask for first exposure region IG1 and the photodiode PD4 is, similar to the photodiodes PD3 and PD4 in the pixel PE2, a light receiving element formed through the mask for second exposure region IG2.

Figure 12:
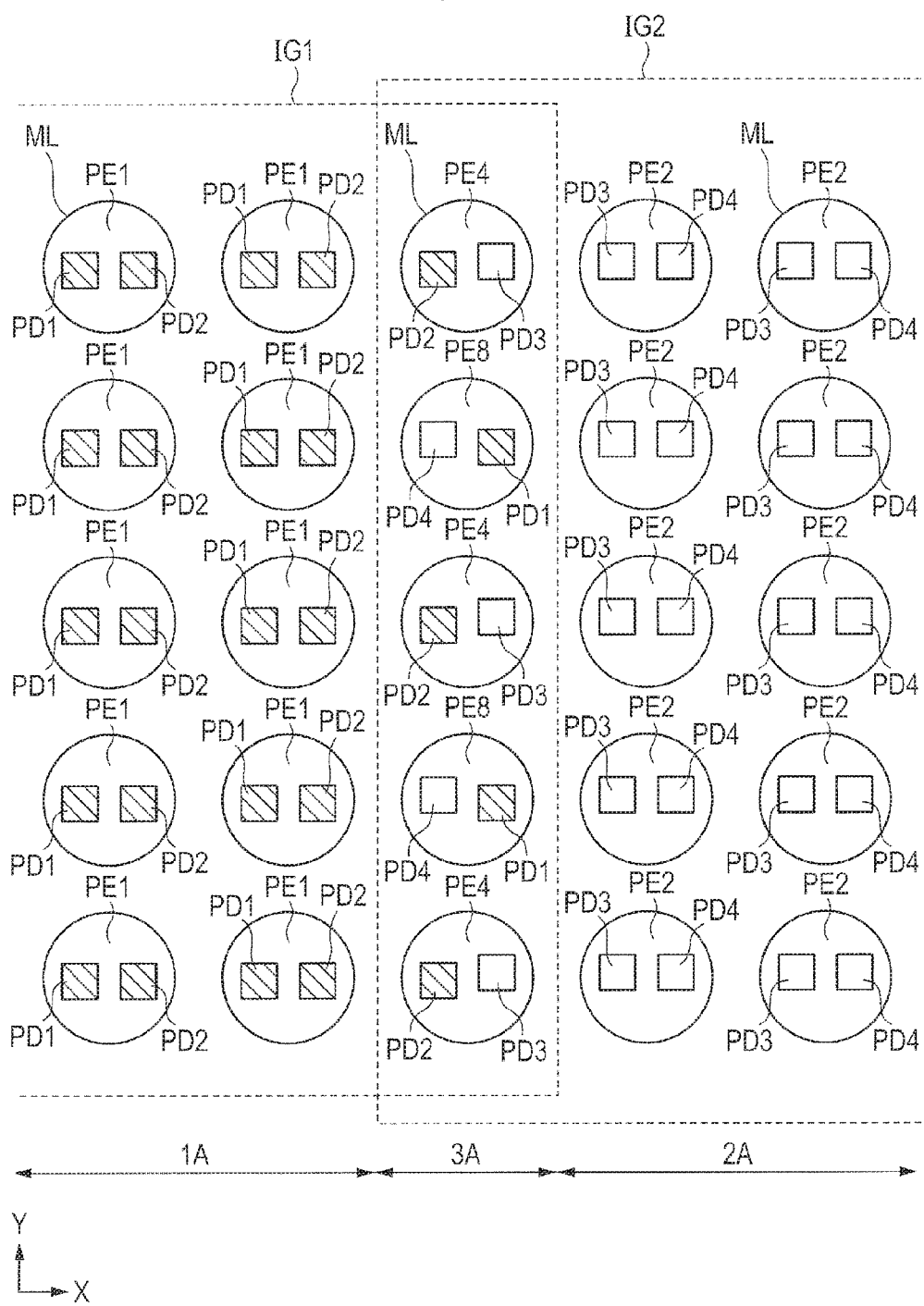
FIG. 12 is a planar layout showing a further semiconductor device of Modification Example 1 of First Embodiment of the invention.

An advantage similar to that obtained by the solid state image sensor shown in FIG. 10 or 11 can be obtained even by, as shown in FIG. 12, alternately placing pixels PE4 and PE8 in the Y-axis direction in the third region 3A and placing the photodiodes PD4 and PD1 in the pixel PE8. The pixel PE4 has a configuration similar to that of FIG. 10. In the pixel PE8, the photodiode PD4 is placed on a side closer to the first region 1A and the photodiode PD1 is placed on a side closer to the second region 2A. FIG. 12 is a planar layout showing a further semiconductor device of Modification Example 1 of the present embodiment.

The photodiode PD1 in the pixel PE8 is, similar to the photodiodes PD1 and PD2 in the pixel PE1, a light receiving element formed through the mask for first exposure region IG1 and the photodiode PD4 is, similar to the photodiodes PD3 and PD4 in the pixel PE2, a light receiving element formed through the mask for second exposure region IG2.

Modification Example 2

Figure 13:
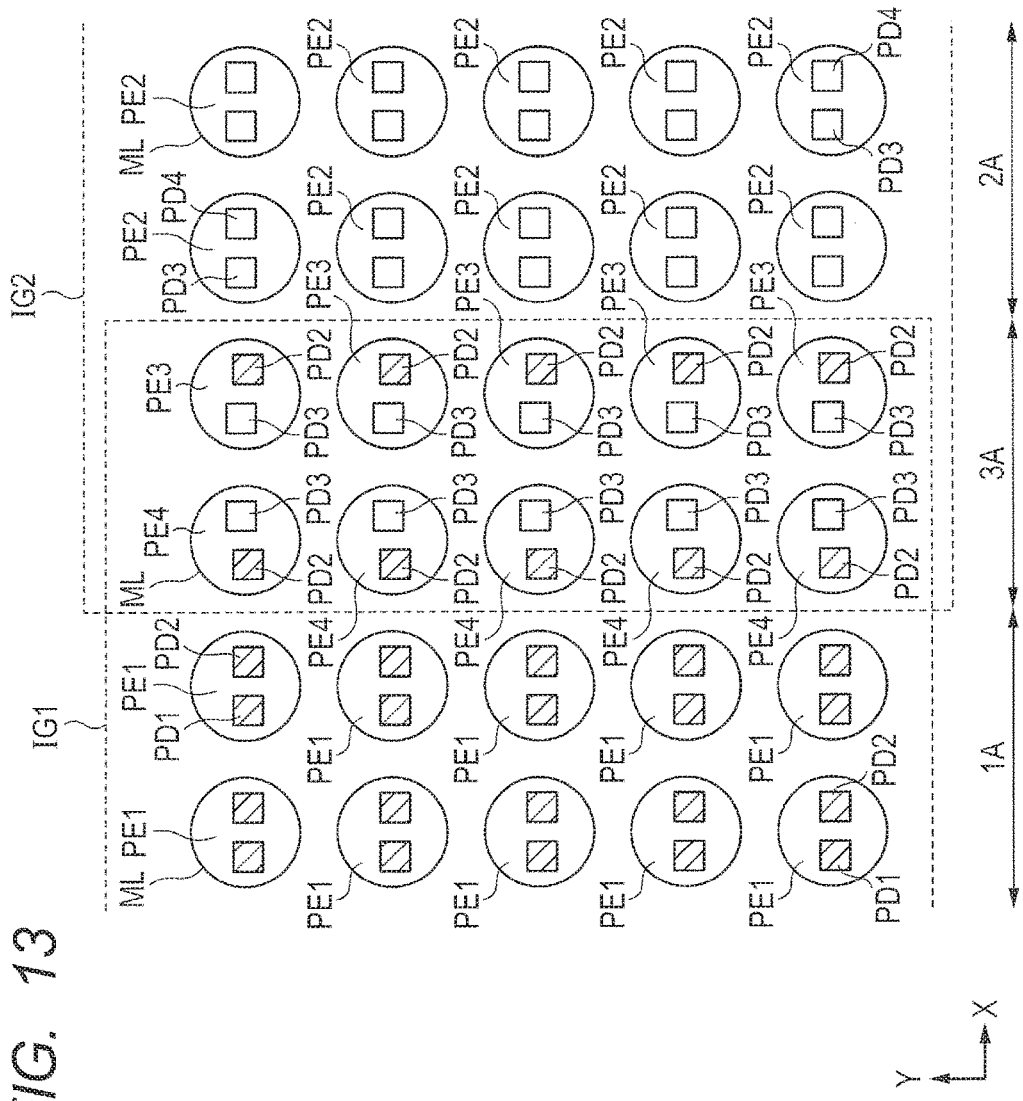
FIG. 13 is a planar layout showing a semiconductor device of Modification Example 2 of First Embodiment of the invention.

Modification Example 2 of the present embodiment will hereinafter be described referring to FIG. 13. FIG. 13 is a planar layout showing a semiconductor device of Modification Example 2 of the present embodiment.

The layout of the present modification example is different from that described referring to FIG. 2 in that in the third region 3A, a column comprised of a plurality of pixels PE4 arranged in the Y-axis direction is added to a column comprised of a plurality of pixels PE3 arranged in the Y-axis direction. The pixel PE4 has a structure similar to that of FIG. 10. A column comprised of a plurality of pixels PE3 and a column comprised of a plurality of pixels PE4 are juxtaposed in the X-axis direction. The column of pixels PE3 is placed on a side closer to the second region 2A and the column of pixels PE4 is placed on a side of the first region 1A.

In short, the layout shown in FIG. 13 has a configuration in which two columns each comprised of pixels arranged in the Y-axis direction in the third region 3A as shown in FIG. 2 are axially symmetrically arranged in the third region 3A.

When in the present modification example, the third region 3A has only one column of pixels having a structure in which formation positions of the right and left photodiodes have been replaced with each other, that is, in which the photodiodes have been mixedly placed, an output level difference on an image between the first exposure region IG1 and the second exposure region IG2 can be made inconspicuous by gradually changing the output level difference. The output level difference on an image is however likely to be recognized because a width of a region for gradually changing the output level difference is small.

In the present modification example, therefore, the output difference between right and left exposure regions is averaged and reduced by forming two columns of pixels in the third region 3A. In addition to the advantage described referring to FIGS. 1 to 9, it is possible to make an output level difference more inconspicuous at a portion, on an image, corresponding to the boundary portion of the divided exposure. In other words, a region capable of averaging an output level difference at the boundary portion can be widened and therefore, the output difference between right and left exposure regions can be made more inconspicuous.

In addition, such arrangement of the pixel PE3 and the pixel PE4 along the X-axis direction means formation of columns in which arrangement of the two photodiodes PD2 and PD3 is exchanged for the microlens ML. This makes it possible to average an output difference due to the asymmetric shape of the microlens and thereby makes it difficult to recognize the output difference on an image.

Figure 14:
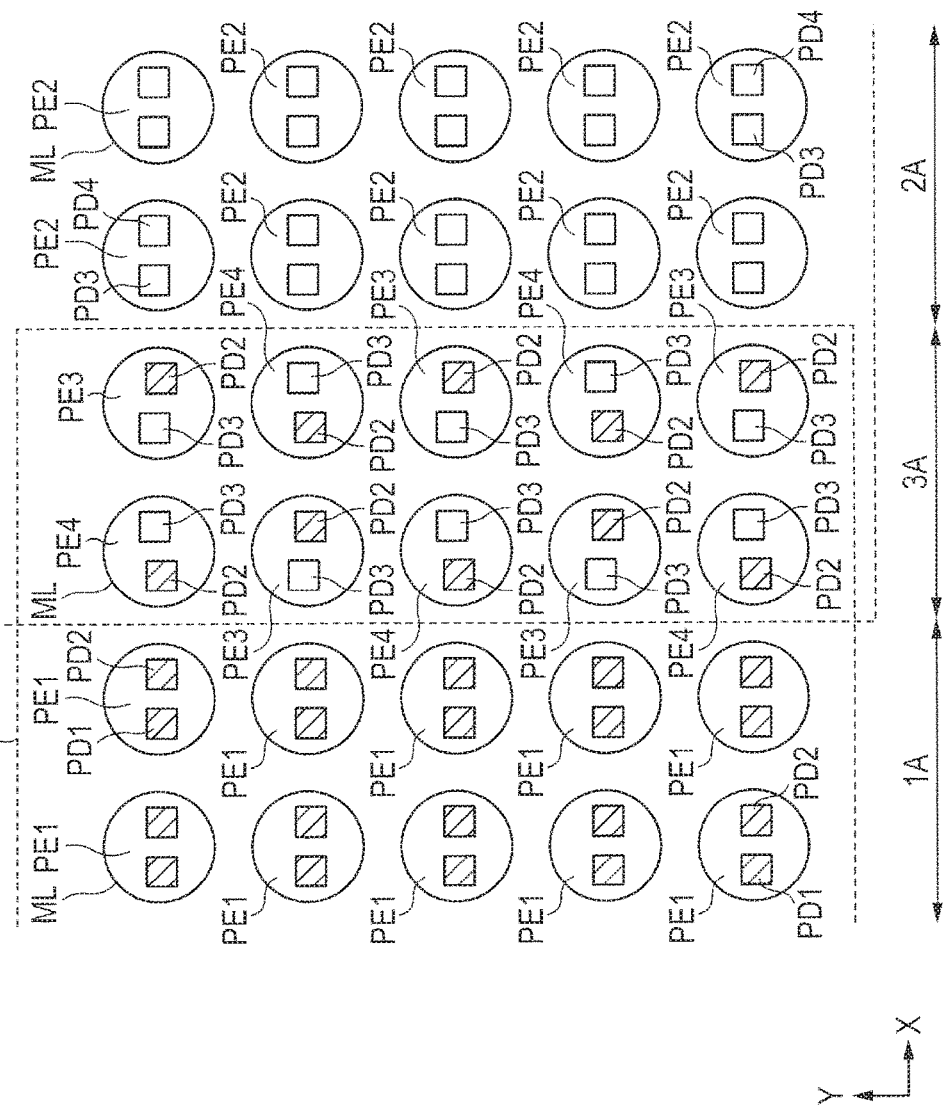
FIG. 14 is a planar layout showing another semiconductor device of Modification Example 2 of First Embodiment of the invention.

As shown in FIG. 14, in each of two columns of the third region 3A, a pixel PE3 and a pixel PE4 may be arranged alternately a plurality of times along the Y-axis direction. In this case, the pixel PE3 and the pixel PE4 are juxtaposed in the X-axis direction. FIG. 14 is a planar layout showing another semiconductor device of Modification Example 2 according to the present embodiment.

In short, the layout shown in FIG. 14 has a configuration in which two columns, each column comprised of pixels arranged along the Y-axis direction in the third region 3A as shown in FIG. 10 are axially symmetrically arranged in the third region 3A.

This makes it possible to average an output difference between columns arranged in the X-axis direction in the third region 3A and between rows arranged in the Y-axis direction in the third region 3A. Compared with the solid state image sensor shown in FIG. 13, that of the present example can make an output level difference on an image more inconspicuous.

Figure 15:
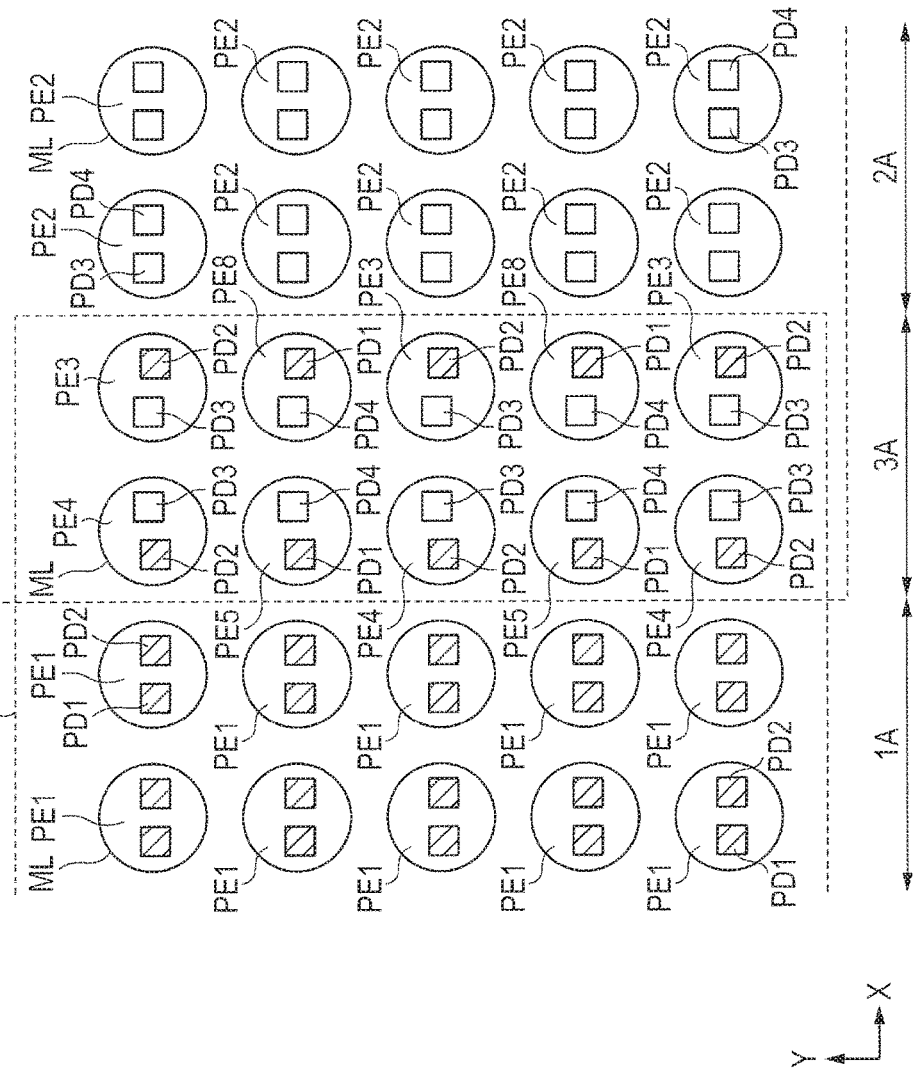
FIG. 15 is a planar layout showing a further semiconductor device of Modification Example 2 of First Embodiment of the invention.

Even when the pixels PE3, PE4, PE5, and PE8 are arranged in the third region 3A as shown in FIG. 15, an advantage similar to that of the solid state image sensor shown in FIG. 14 can be obtained. FIG. 15 is a planar layout showing the semiconductor device of Modification Example 2 of the present embodiment.

In the third region 3A, the pixels PE5 and PE8 are juxtaposed in a certain row and the pixels PE3 and PE4 are juxtaposed in a row adjacent to the above row in the Y-axis direction. In other words, the pixel PE8 is placed between the pixels PE3 adjacent to each other in the Y-axis direction and the pixel PE5 is placed between the pixels PE4 adjacent to each other in the Y-axis direction. In the third region 3A, a column including the pixels PE4 and PE5 is placed on the side of the first region 1A and a column including the pixels PE3 and PE8 is placed on the side of the second region 2A.

Modification Example 3

Figure 16:
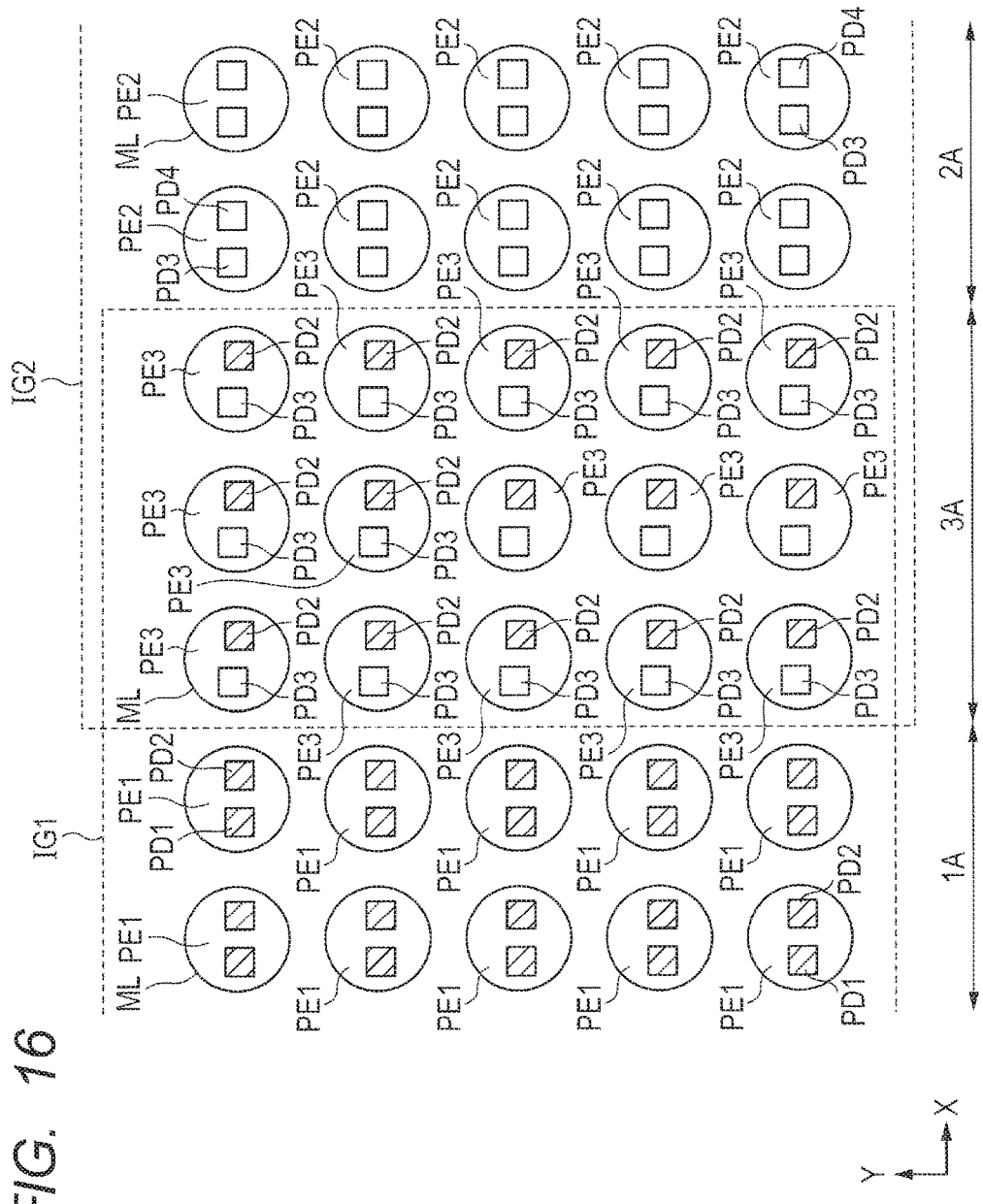
FIG. 16 is a planar layout showing a semiconductor device of Modification Example 3 of First Embodiment of the invention.

Modification Example 3 of the present embodiment will hereinafter be described referring to FIG. 16. FIG. 16 is a planar layout showing a semiconductor device of Modification Example 3 of the present embodiment.

The layout of the present modification example is different from that described referring to FIG. 2 in that in the third region 3A, three columns each comprised of a plurality of pixels PE3 arranged in the Y-axis direction are juxtaposed in the X-axis direction. The output difference between the first exposure region IG1 and the second exposure region IG2 is averaged and reduced over a wide range by increasing the number of columns of the third region 3A to three. By such a configuration, an output level difference on an image between the divided regions can be made more inconspicuous.

Here, the pixels PE3 are arranged in matrix form in the third region 3A, but instead, the pixels PE4 shown in FIG. 10 may be arranged in matrix form. More specifically, in the pixels arranged in the third region 3A, the photodiodes PD2 formed through the mask for first exposure region IG1 may be placed on the side of the first region 1A and the photodiodes PD3 formed through the mask for second exposure region IG2 may be placed on the side of the second region 2A. In this case, since there are some pixels in which respective positions of two photodiodes are replaced with each other for the microlens ML, an output difference due to asymmetric shape of the microlens can be averaged.

Here, described is the third region 3A in which three columns are arranged in the X-axis direction, but the number of the columns may be four or more.

Figure 17:
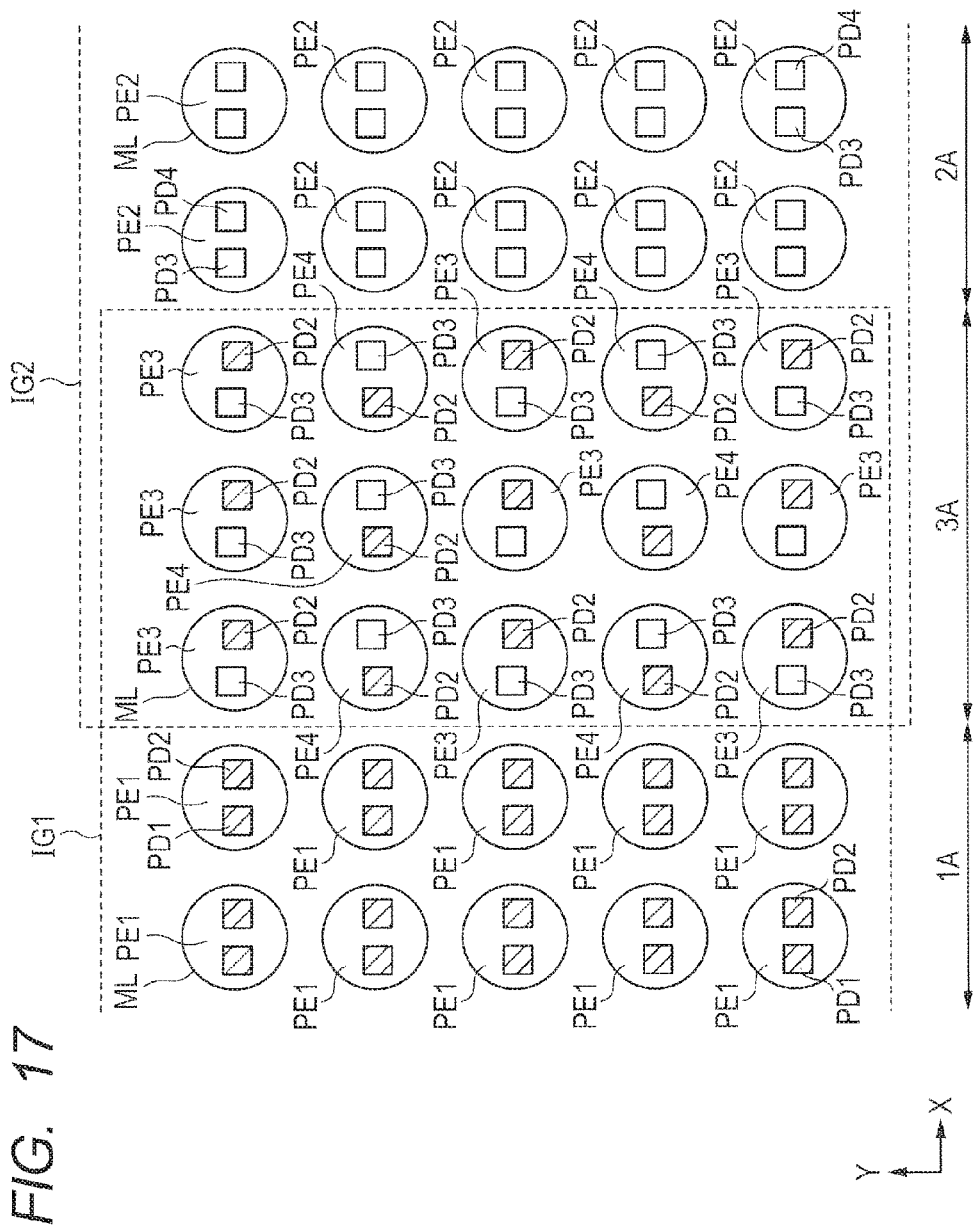
FIG. 17 is a planar layout showing another semiconductor device of Modification Example 3 of First Embodiment of the invention.

As shown in FIG. 17, in each of a plurality of columns in the third region 3A, a pixel PE3 and a pixel PE4 may be alternately arranged a plurality of times in the Y-axis direction. In this case, only a plurality of pixels PE3 is juxtaposed in the X-axis direction in a certain row in the third region 3A and in a row adjacent thereto in the Y-axis direction, only a plurality of pixels PE4 is juxtaposed in the X-axis direction. FIG. 17 is a planar layout showing another semiconductor device of Modification Example 3 of the present embodiment.

In this case, in addition to an output difference between the first exposure region IG1 and the second exposure region IG2 in the X-axis direction, an output difference in the Y-axis direction can be averaged.

Figure 18:
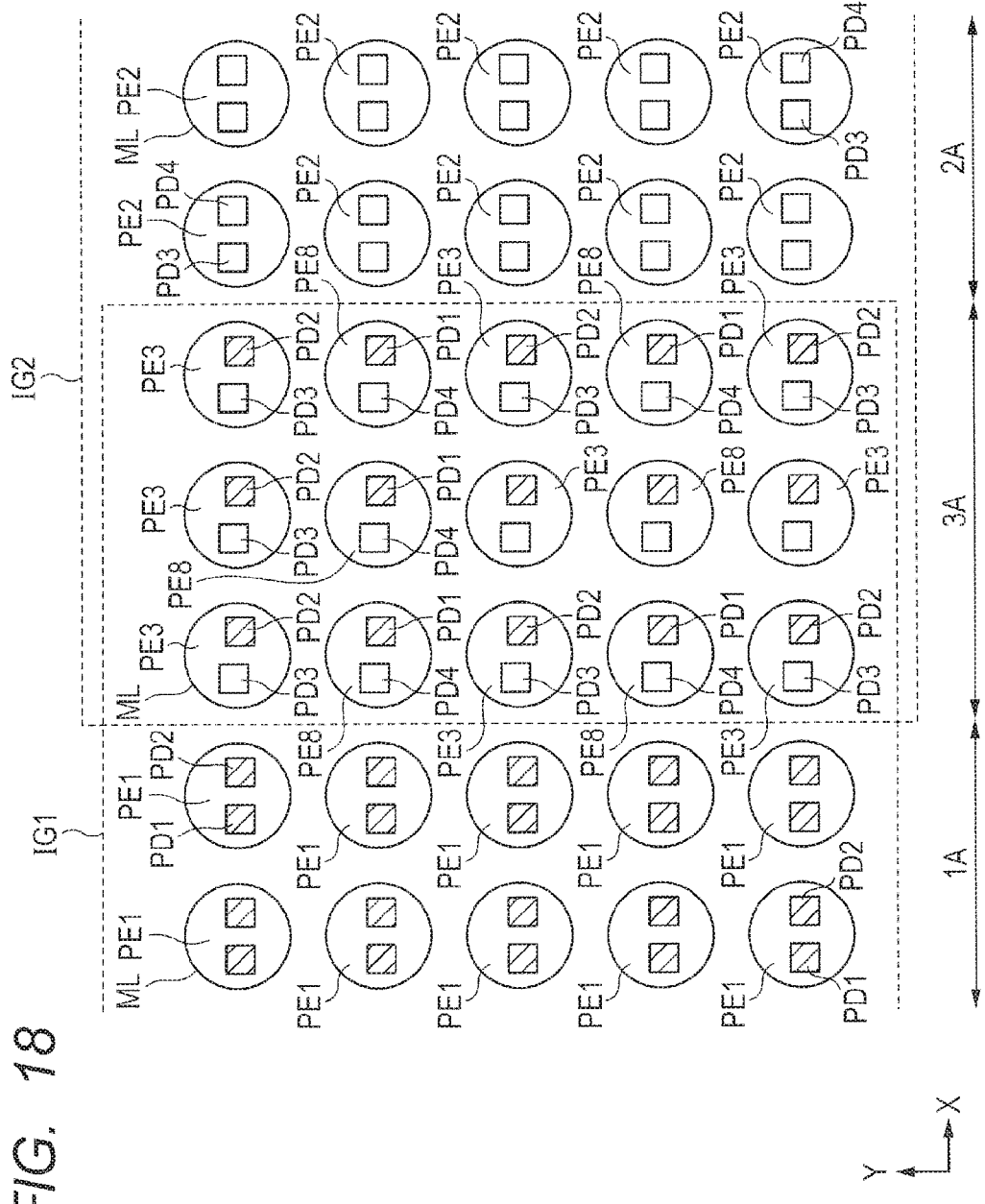
FIG. 18 is a planar layout showing a further semiconductor device of Modification Example 3 of First Embodiment of the invention.

As shown in FIG. 18, in each of a plurality of columns of the third region 3A, a pixel PE3 and a pixel PE8 may be juxtaposed alternately a plurality of times in the Y-axis direction. FIG. 18 is a planar layout of a further semiconductor device of Modification Example of the present embodiment.

In this case, in a certain row in the third region 3A, only a plurality of pixels PE3 is juxtaposed in the X-axis direction and in the row adjacent thereto in the Y-axis direction, only a plurality of pixels PE8 is juxtaposed in the X-axis direction. The pixels PE8 have a structure similar to that of the pixel PE8 described referring to FIG. 12.

In this case, in addition to an output difference between the first exposure region IG1 and the second exposure region IG2 in the X-axis direction, an output difference in the Y-axis direction can be averaged. Further, since photodiodes differ in each row, an output difference between the first exposure region IG1 and the second exposure region IG2 in the X-axis direction and also that in the Y-axis direction can be averaged.

Modification Example 4

Figure 19:
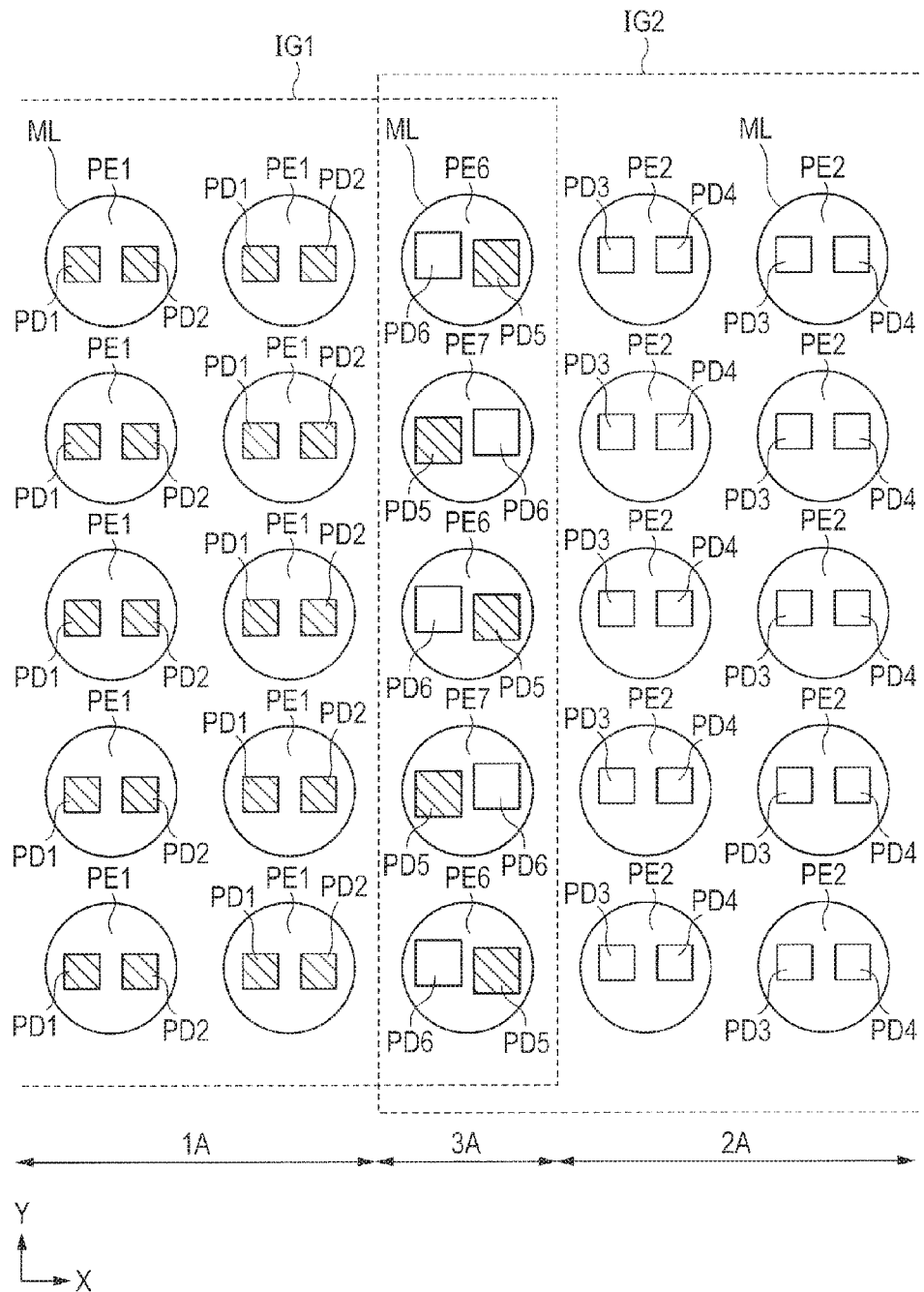
FIG. 19 is a planar layout showing a semiconductor device of Modification Example 4 of First Embodiment of the invention.

Modification Example 4 of the present embodiment will hereinafter be described referring to FIG. 19. FIG. 19 is a planar layout showing a semiconductor device of Modification Example 4 according to the present embodiment.

The layout of the present modification example is different from that described referring to FIG. 10 in that an area, in plan view, of each of photodiodes PD5 and PD6 formed in pixels PE6 and PE7 in the third region 3A is larger than that of the photodiodes PD1 to 4 in the first region 1A and the second region 2A.

The pixels PE6 and PE7 each have a photodiode PD5 and a photodiode PD6. In the pixel PE6, the photodiode PD5 is placed on the side of the second region 2A and the photodiode PD6 is placed on the side of the first region 1A. On the contrary, in the pixel PE7, the photodiode PD5 is placed on the side of the first region 1A and the photodiode PD6 is placed on the side of the second region 2A. The photodiode PD5 is, similar to the photodiodes PD1 and PD2, a light receiving element formed through the mask for first exposure region, and the photodiode PD6 is, similar to the photodiodes PD3 and PD4, a light receiving element formed through the mask for second exposure region IG2.

This means that the layout of the present modification example is similar to that described referring to FIG. 10 in that inside each of the pixels PE6 and PE7, the photodiodes PD5 and PD6 are formed through respectively different masks and in each of the pixels PE6 and PE7 arranged along the Y-axis direction, the photodiodes are replaced with each other.

Here, an area of the photodiodes PD5 and PD6 of only the pixels PE6 and PE7 in the boundary region (third region 3A) is made greater. When divided exposure causes misalignment, only the area of one of the photodiodes in one pixel may substantially decrease. In this case, the output of some photodiodes in the third region 3A decreases, leading to deterioration in image quality and delay of autofocusing. In the present modification example, on the other hand, since the photodiodes PD5 and PD6 configuring the pixels PE6 and PE7 in the third region 3A have a larger area according to their layout design, an influence of the output reduction can be reduced. As a result, an output level difference on an image in the divided region can be made inconspicuous.

The photodiode can be enlarged by increasing the formation area of the N⁻ type semiconductor regions N1 and N2 in the active region AR shown in FIG. 3. The area of the active region AR shown in FIG. 3, as well as the area of the photodiode, may be enlarged.

Figure 20:
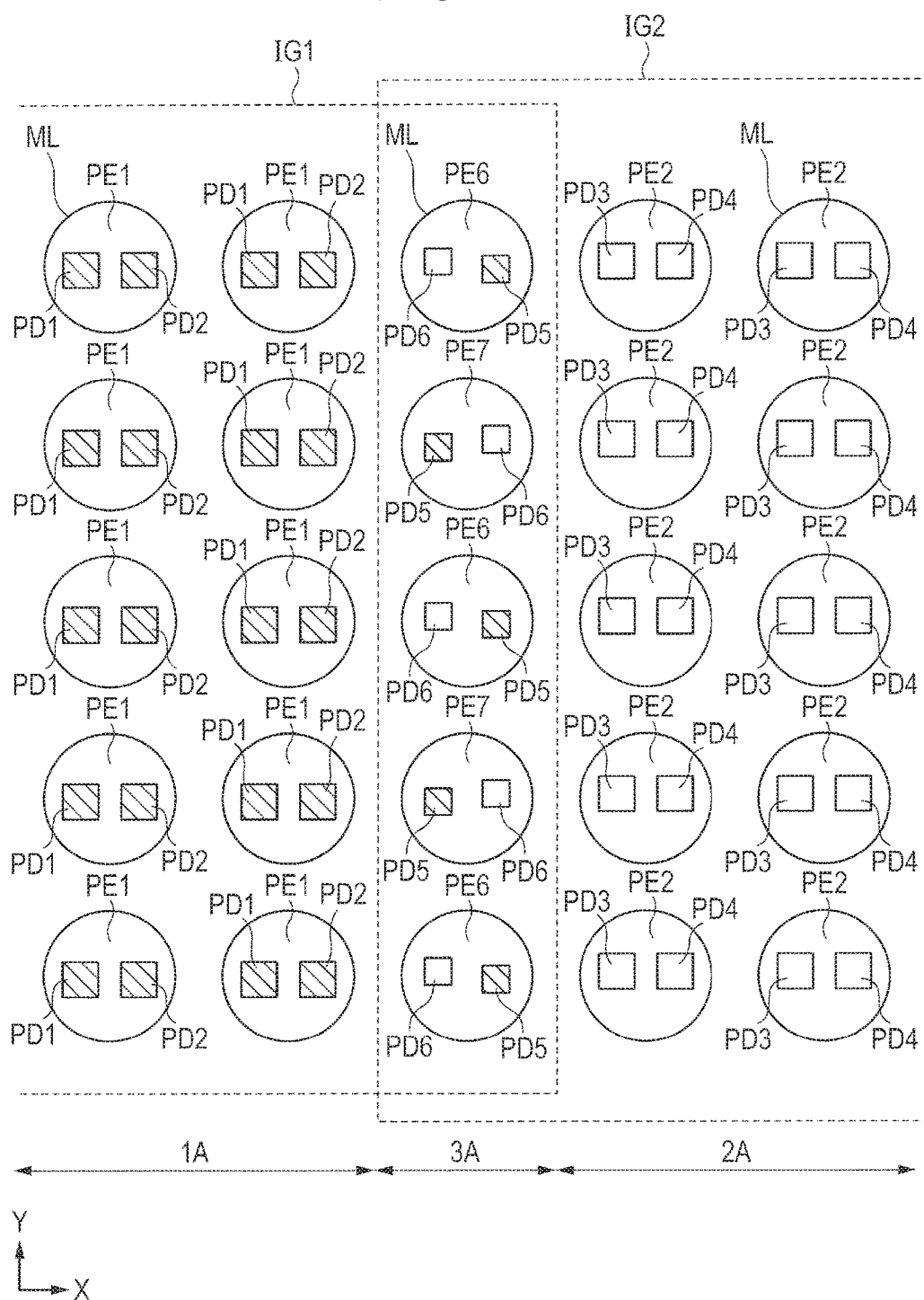
FIG. 20 is a planar layout showing another semiconductor device of Modification Example 4 of First Embodiment of the invention.

As shown in FIG. 20, the area of each of the photodiodes PD5 and PD6 in plan view may be smaller than that of the photodiodes PD1 to PD4 in the first region 1A and the second region 2A. FIG. 20 is a planar layout showing another semiconductor device of Modification Example 4 of the present embodiment. This makes it possible to prevent the distance between the active regions or between the photodiodes from narrowing due to misalignment of masks used respectively for the first exposure region IG1 and the second exposure region IG2 and thereby preventing generation of leakage between the active regions or between photodiodes. Accordingly, generation of an output level difference in the third region 3A and delay in autofocusing resulting from the leakage can be prevented.

In this example, the distance between the photodiodes PD5 and PD6 can be kept large in each of the pixel PE6 and the pixel PE7. In addition, the distance between each of the photodiodes PD5 and PD6 and the end portion of the active region including the photodiodes PD5 and PD6 can be kept large. It is therefore possible to prevent narrowing of an area of the photodiode when due to misalignment of masks used for the first exposure region IG1 and the second exposure region IG2, respectively, the formation region of the active region or the photodiode is misaligned. An output level difference between the divided regions on an image can be prevented.

Photodiodes having a smaller area may be formed by reducing the areas for the formation of the N⁻ type semiconductor region N1 and N2 in the active region AR shown in FIG. 3.

Figure 21:
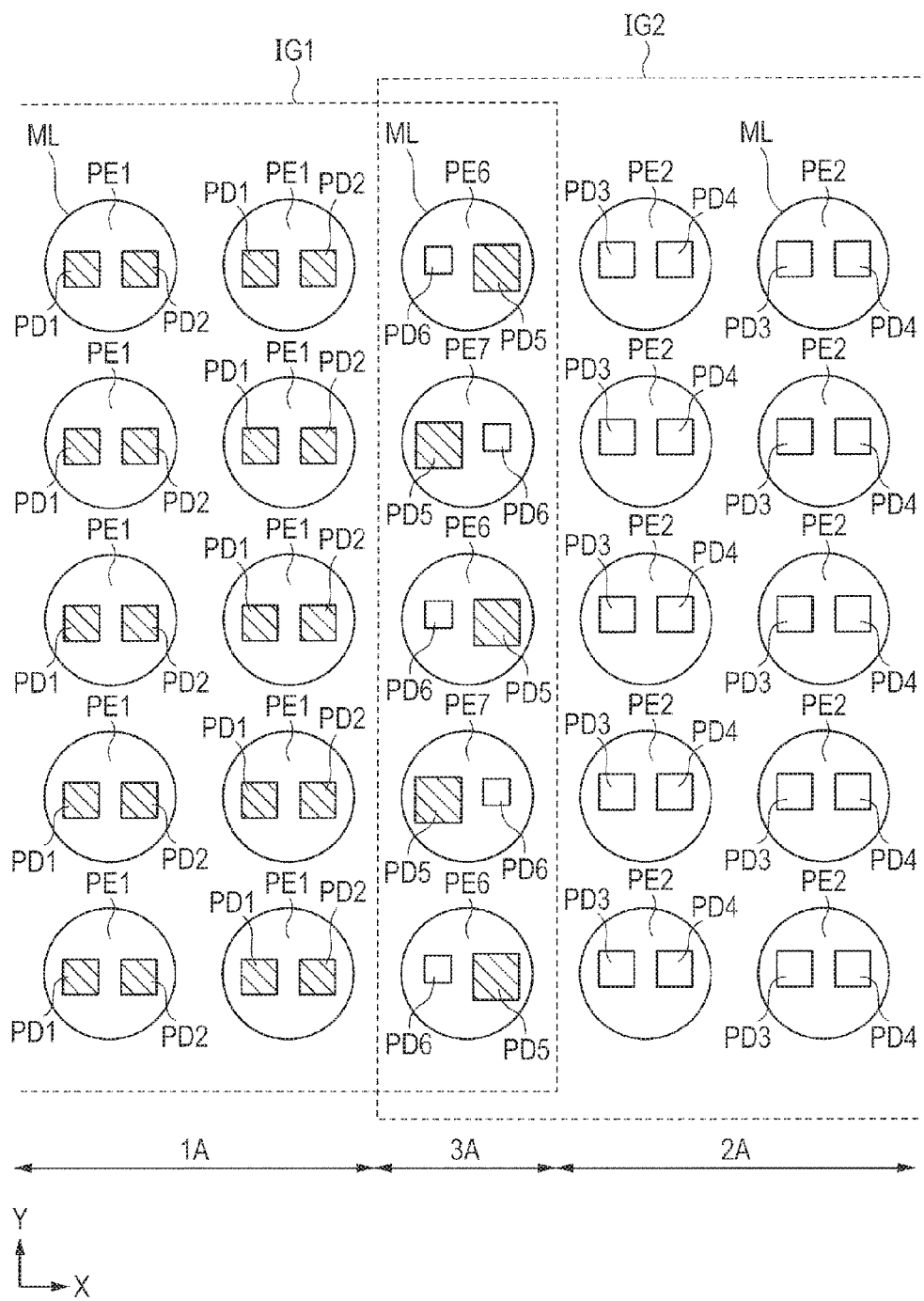
FIG. 21 is a planar layout showing a further semiconductor device of Modification Example 4 of First Embodiment of the invention.

As shown in FIG. 21, the area of the photodiode PD5, of the photodiodes PD5 and PD6 in each pixel in the third region 3A, may be made larger than that of each of the photodiodes PD1 to PD4 and the area of the photodiode PD6 may be made smaller than that of the photodiodes PD1 to PD4. FIG. 21 is a planar layout showing a further semiconductor device of Modification Example 4 of the present embodiment.

Defining in advance the photodiode PD5 having a large layout and the photodiode PD6 having a small layout inside each of the pixels PE6 and PD7 in the third region 3A is effective for specifying a measurement position easily when the pattern size of the photodiode at shot end of the first exposure region IG1 or the second exposure region IG2 is monitored for size measurement at the time of manufacturing.

In each of the pixel PE6 and the pixel PE7, the distance between the photodiodes PD5 and PD6 can be kept large. In addition, the distance between the photodiode PD6 and an end portion of the active region including the photodiode PD6 can be kept large.

Even when formation positions of the active region, the photodiode PD5, or the photodiode PD6 is misaligned due to misregistration of respective masks used for the first exposure region IG1 and the second exposure region IG2, the area of the photodiode PD6 can be prevented from decreasing. In addition, the leakage between the photodiodes PD5 and PD6 can be prevented by decreasing the size of the photodiode PD6. As a result, generation, on an image, of an output level difference in the divided regions can be prevented.

Figure 22:
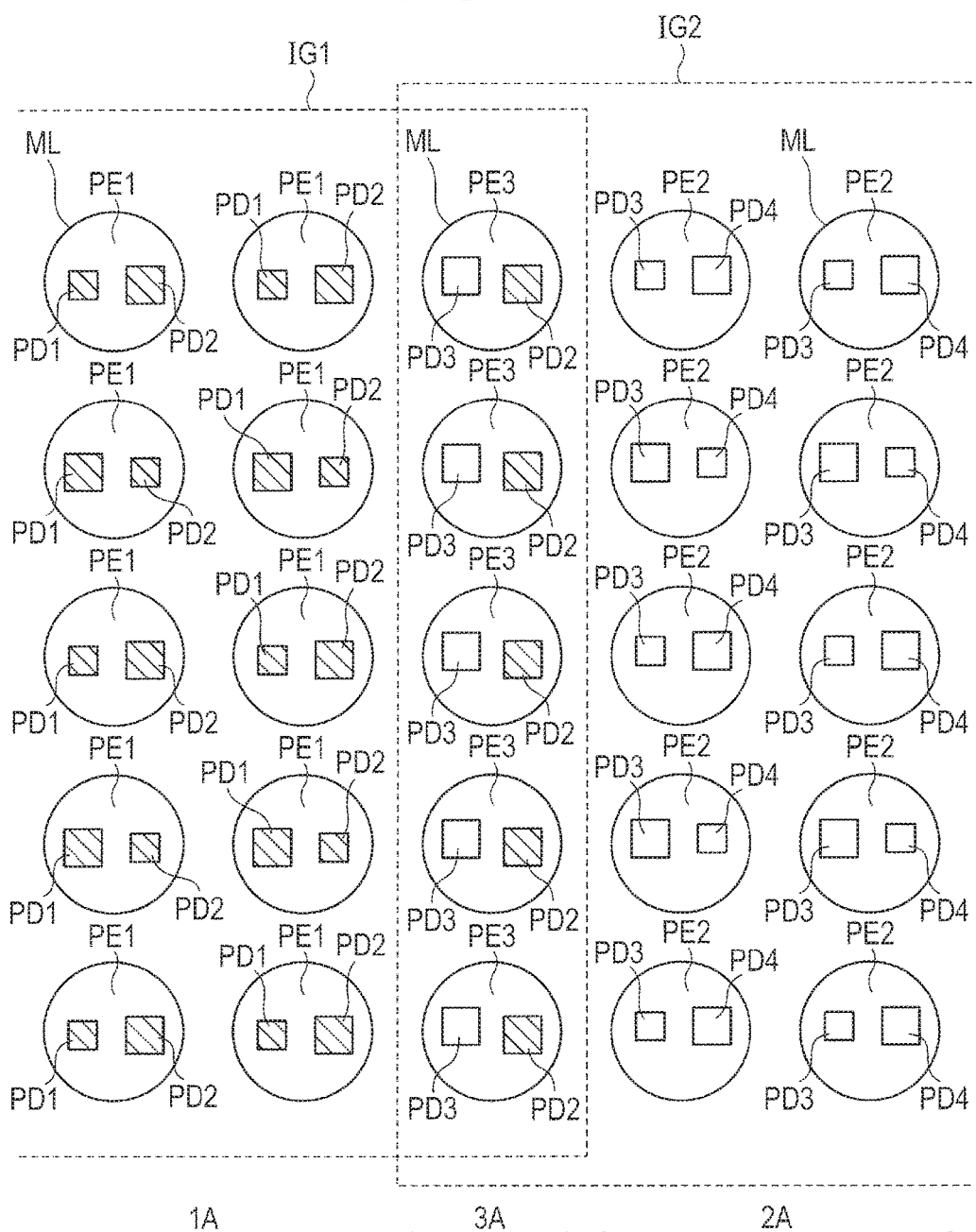
FIG. 22 is a planar layout showing a still further semiconductor device of Modification Example 4 of First Embodiment of the invention.

It is also possible to juxtapose a plurality of pixels PE3 in one column in the Y-axis direction in the third region 3A and decrease the area of one of two photodiodes which each pixel in the first region 1A or the second region 2A has, as shown in FIG. 22. FIG. 22 is a planar layout showing a still further semiconductor device of Modification Example 4 of the present embodiment.

The configuration shown in FIG. 22 is different from the configuration shown in FIG. 2 in that in the first region 1A and the second region 2A, some photodiodes PD1 to PD3 have an area smaller than that of the other photodiodes.

This means that in the pixels PE1 of a certain row arranged in the X-axis direction, the area of the photodiode PD1 is smaller than that of the photodiode PD2. In the pixels PE1 of a row adjacent to the above certain row in the Y-axis direction, the area of the photodiode PD2 is smaller than that of the photodiode PD1.

Thus, the pixel PE1 in the first region 1A has a photodiode having a relatively small area and the area of this photodiode is smaller than the area of each of the photodiodes PD2 and PD3 in the pixel PE3. In the pixel PE1, a photodiode juxtaposed with the above-described photodiode having a relatively small area has an area equivalent to that of the photodiode PD2 or PD3 in the pixel PE3 (which may hereinafter be called "standard area").

In a certain column in the first region 1A, a photodiode PD1 having a standard area and a photodiode PD1 having an area smaller than that of the above photodiode PD1 are juxtaposed alternately in the Y-axis direction. In a column adjacent to the certain column in the first region 1A, a photodiode PD2 having a standard area and a photodiode PD2 having an area smaller than that of the above photodiode PD2 are alternately juxtaposed in the Y-axis direction.

In a certain row in the first region 1A, a photodiode PD1 having a standard area and a photodiode PD2 having an area smaller than that of the photodiode PD1 are alternately juxtaposed in the X-axis direction. In a column adjacent to the certain column in the first region 1A, a photodiode PD2 having a standard area and a photodiode PD1 having an area smaller than that of the photodiode PD2 are alternately juxtaposed in the X-axis direction.

Similarly, the pixel PE2 in the second region 2A has a photodiode having a relatively small area and the area of this photodiode is smaller than the respective areas of the photodiodes PD2 and PD3 in the pixel PE3. In the pixel PE2, a photodiode juxtaposed with the above photodiode having a relatively small area has an area equal to the respective areas of the photodiodes PD2 and PD3 in the pixel PE3.

In a certain column in the second region 2A, a photodiode PD3 having a standard area and a photodiode PD3 having an area smaller than that of the above photodiode PD3 are alternately juxtaposed in the Y-axis direction. In a column adjacent to the certain column in the second region 2A, a photodiode PD4 having a standard area and a photodiode having an area smaller than that of the above photodiode PD4 are alternately juxtaposed in the Y-axis direction.

In a certain row in the second region 2A, a photodiode PD3 having a standard area and a photodiode PD4 having an area smaller than that of the above photodiode PD3 are alternately juxtaposed in the X-axis direction. In a row adjacent to the certain row in the second region 2A, a photodiode PD4 having a standard area and a photodiode PD3 having an area smaller than that of the photodiode PD4 are alternately juxtaposed in the X-axis direction.

In a certain row in the pixel array portion, the pixel PE1 has a photodiode PD1 having a small are and the pixel PE2 has a photodiode PD3 having a small area and in a row adjacent to the certain row, the pixel PE1 has a photodiode PD2 having a small area and the pixel PE2 has a photodiode PD4 having a small area.

Thus, in the layout shown in FIG. 22, a difference is provided in the area of the active region or photodiode formed in each of the pixel PE1 and PE2 in regions other than the boundary region (the third region 3A). In the third region 3A, there may occur an output difference between the photodiodes PD2 and PD3 in one pixel PE3 due to an overlapping error of two masks used for divided exposure. In such a case, by providing a size difference in advance between two photodiodes of the pixel PE1 or PE2 in regions other than the third region 3A as shown in FIG. 22, the outputs of all the pixels PE1 to PE3 arranged in the pixel array portion can be averaged.

This means that even when there occurs an output difference between two photodiodes in the pixel PE3, the output difference can be made inconspicuous in the resulting solid image pickup device as a whole. In this example, the photodiodes having a larger area and a smaller area are alternately arranged in each row so that an output difference in the boundary region cannot be recognized easily when an image obtained using the solid state image sensor is viewed as a whole. This makes it possible to prevent generation of image abnormalities attributable to divided exposure.

When two photodiodes with the same area are formed for each pixel, one of the photodiodes manufactured by some semiconductor device manufacturing apparatuses unintentionally becomes larger. When a manufacturing apparatus having such a characteristic is used, it is possible to prevent variations in the area between these photodiodes and thereby prevent generation of image abnormalities attributable to divided exposure by designing the photodiodes PD1 and PD3 inside each of the pixels PE1 and PE2 to have a small area in advance as shown in FIG. 22. Such a characteristic may occur in a manufacturing step of a semiconductor device, for example, a step of forming photodiodes on a semiconductor substrate having a main surface with a level difference.

The two photodiodes in each of the pixels PE1 and PE2 have areas different from each other so that in image-plane phase-detection system autofocusing of the solid state image sensor shown in FIG. 22, whether it is focused or not is determined by comparing an average output of photodiodes on the left side in four pixels adjacent to each other in the X-axis direction and Y-axis direction with an average output of photodiodes on the right side in these four pixels.

Second Embodiment

Figure 23:
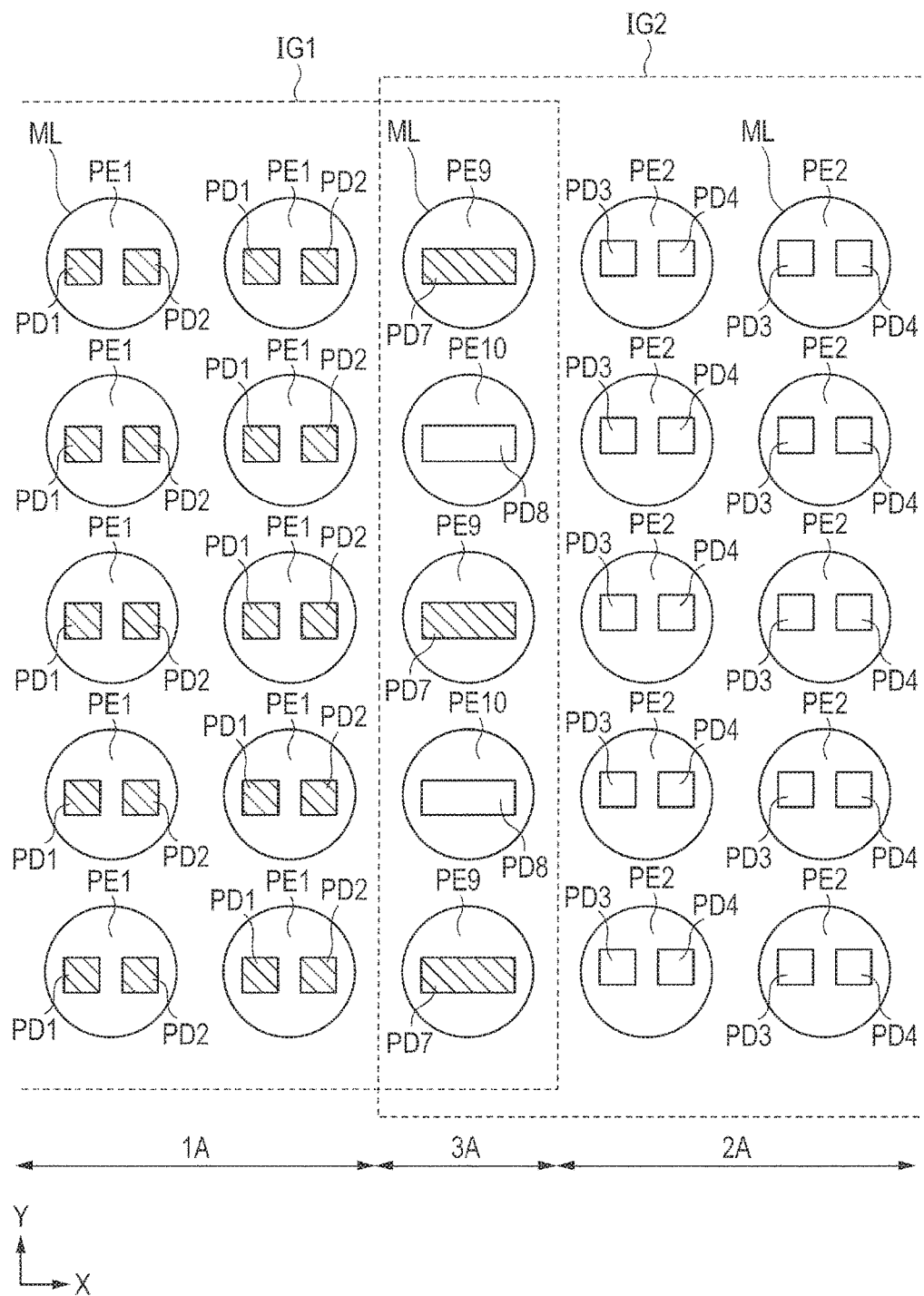
FIG. 23 is a planar layout showing a semiconductor device of Second Embodiment of the invention.

A semiconductor device of Second Embodiment will hereinafter be described referring to FIG. 23. FIG. 23 is a planar layout showing the semiconductor device of the present embodiment.

The configuration of the present embodiment differs from that of the above embodiment described referring to FIG. 2 in that the pixels in the third region 3A each have only one photodiode having an area greater than that of the photodiodes PD1 to PD4 and do not have another photodiode.

As shown in FIG. 23, in the third region 3A, a pixel PE9 and a pixel PE10 are juxtaposed alternately a plurality of times along the Y-axis direction. The pixel PE9 and the pixel PE10 each have only one photodiode. In other words, in the third region 3A, only one photodiode overlaps with one microlens ML in plan view. The pixel PE9 has a photodiode PD7 having an area greater than that of each of the photodiodes PD1 to PD4 in plan view. The pixel PE10 has a photodiode PD8 having an area greater than that of each of the photodiodes PD1 to PD4 in plan view.

The photodiodes PD7 and PD8 have areas equal to each other. The area of each of the photodiodes PD7 and PD8 approximates a sum of the area of the photodiode PD1 and the area of the photodiode PD2. This means that the area of each of the photodiodes PD7 and PD8 approximates the sum of the area of the photodiode PD3 and the area of the photodiode PD4.

The photodiode PD7 is, similar to the photodiodes PD1 and PD2, a light receiving element formed through the mask for first exposure region IG1. The photodiode PD8 is, similar to the photodiodes PD3 and PD4, a light receiving element formed through the mask for second exposure region IG2. In the third region 3A, the photodiode PD7 and the photodiode PD8 formed through respectively different masks are arranged alternately in the Y-axis direction.

In order to perform image-plane phase-detection system autofocusing of the solid state image sensor, almost all the pixels in the pixel array portion have two photodiodes, but in the third region 3A, one pixel has only one photodiode. The image-plane phase-detection system autofocusing is therefore not performed in the pixels PE9 and PE10 in the third region 3A.

When two photodiodes are formed in the pixel in the third region 3A, there may occur an output difference between the two photodiodes due to an overlapping error of two masks used for divided exposure. This may cause abnormalities on an image available by imaging. In the present embodiment, on the other hand, since the number of a photodiode formed in each of the pixels PE9 and PE10 in the third region 3A is limited to one, occurrence of an output difference between pixels in the third region 3A due to divided exposure can be prevented.

In the present embodiment, the active region and the photodiode of the pixel PE9 are formed using only the mask for first exposure region IG1 so that there occurs no variation in the area of the photodiode due to partial misalignment of the active region in the pixel PE9. Similarly, the active region and the photodiode of the pixel PE10 are formed using only the mask for second exposure region IG2 so that no variation in the area of the photodiode occurs in the pixel PE10. It is therefore possible to effectively prevent occurrence of a level difference at a position, on a static image available by the solid state image sensor, corresponding to the divided region.

Modification Example

Figure 24:
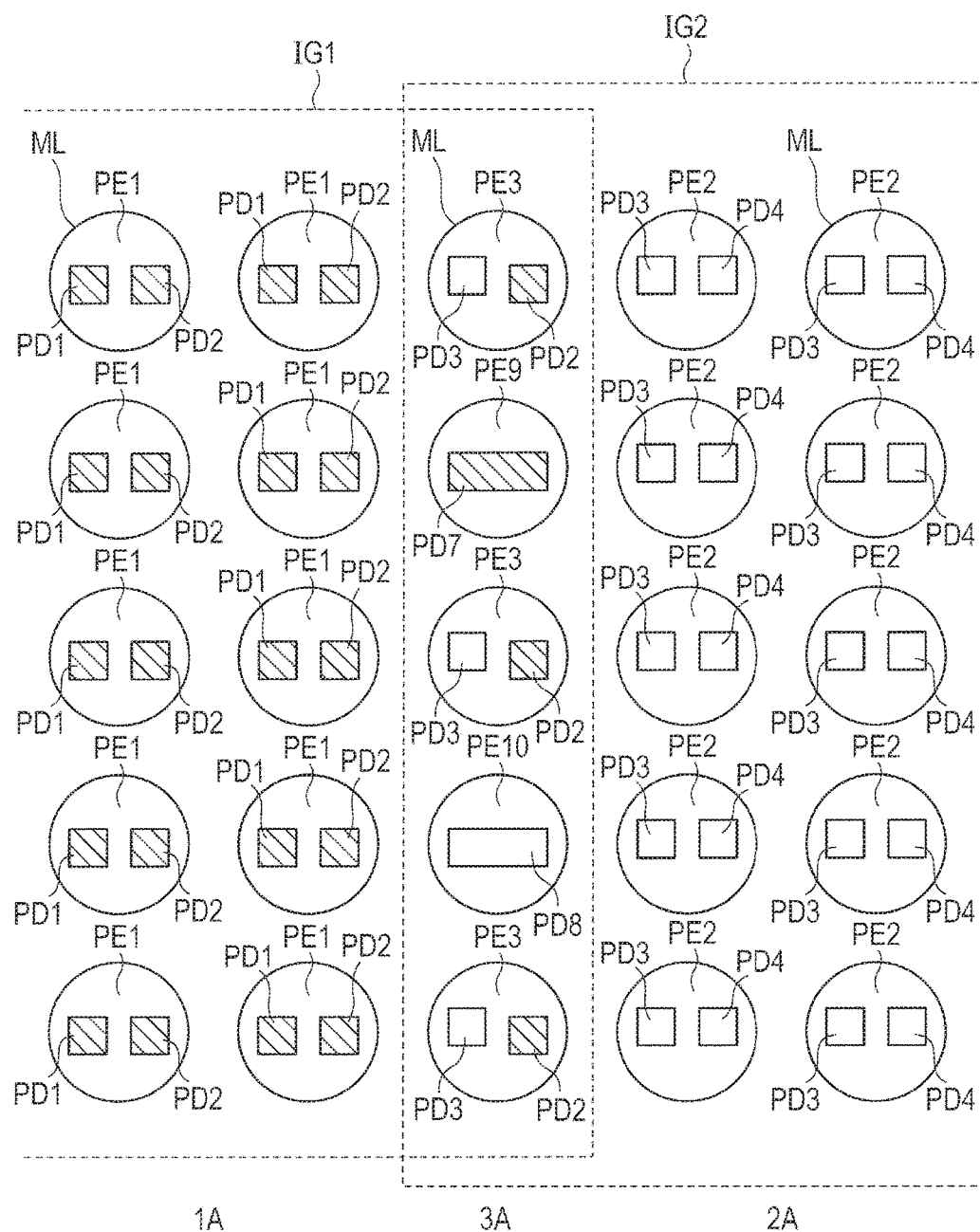
FIG. 24 is a planar layout showing a semiconductor device of a modification example of Second Embodiment of the invention.
Figure 25:
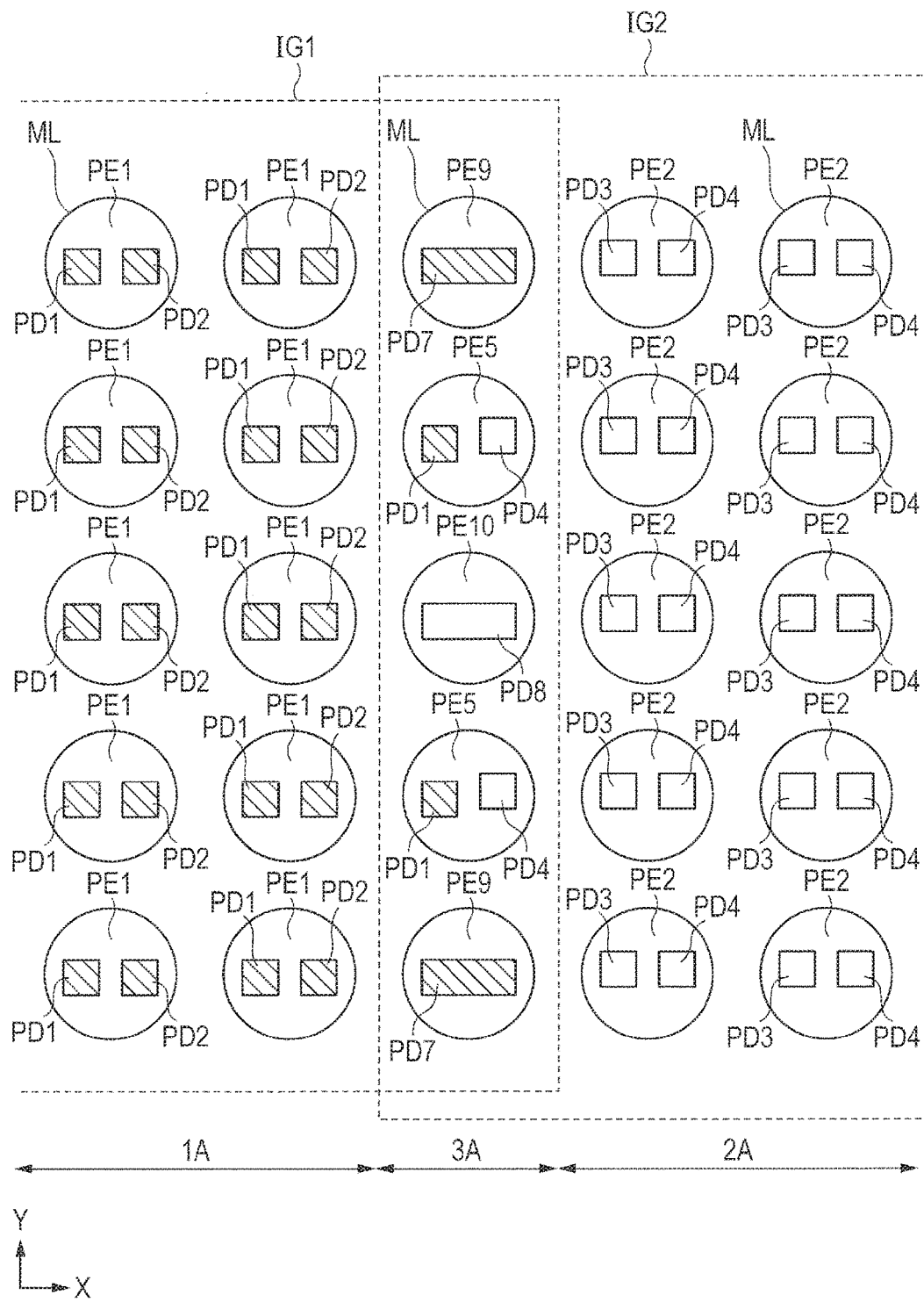
FIG. 25 is a planar layout showing a semiconductor device of another modification example of Second Embodiment.

As shown in FIGS. 24 and 25, a pixel having two photodiodes may be provided between the pixel PE9 and the pixel PE10 in the third region 3A. FIGS. 24 and 25 are planar layouts of semiconductor devices, each a modification example of the present embodiment.

FIG. 24 shows a structure in which a pixel PE3 having photodiodes PD3 and PD2 is placed between the pixel PE9 and the pixel PE10 in the third region 3A. This means that in the third region 3A, pixels PE3, PE9, PE3, PE10, and PE3 are arranged in the order of mention in the Y-axis direction. The configuration of the pixel PE3 is similar to the pixel PE3 described referring to FIG. 2.

FIG. 25 shows a structure in which a pixel PE5 having photodiodes PD1 and PD4 is placed between the pixels PE9 and PE10 in the third region 3A. This means that in the third region 3A, the pixels PE9, PE5, PE10, PE5, and PE9 are arranged in the order of mention in the Y-axis direction. The configuration of the pixel PE5 is similar to that of the pixel PE5 described referring to FIG. 11.

In the present modification example shown in FIGS. 24 and 25, an output level difference of pixels can be reduced by placing a pixel having only one photodiode in the third region 3A where exposure regions overlap with each other. By placing a pixel having two photodiodes in addition, focusing detection can be achieved in a portion of the third region 3A.

The invention made by the present inventors has been described based on some embodiments. It is needless to say that the invention is not limited to or by these embodiments but can be changed without departing from the gist of the invention.

What is claimed is:

1. A semiconductor device having a solid state image sensor, comprising:

a semiconductor substrate having a first region and a second region arranged successively in a first direction along a main surface of the semiconductor substrate and a third region extending between the first region and the second region;

a plurality of first pixels juxtaposed in matrix form in the first direction and a second direction orthogonal to the first direction in the first region;

a plurality of second pixels juxtaposed in matrix form in the first direction and the second direction in the second region;

a plurality of third pixels formed in the third region; and a plurality of first photodiodes, second photodiodes, third photodiodes, and fourth photodiodes formed in the main surface of the semiconductor substrate, wherein the first pixels each have the first photodiode and the second photodiode placed in order of mention in the first direction, wherein the second pixels each have the third photodiode and the fourth photodiode placed in order of mention in the first direction, wherein in the third pixels juxtaposed with the first pixels and the second pixels in the first direction, the second photodiode and the third photodiode are arranged, wherein the third photodiode and the fourth photodiode are deviated in one direction in plan view from the first photodiode and the second photodiode, and wherein in each of the third pixels, the second photodiode is placed at a position closer to the second region than the third photodiode is.

2. The semiconductor device according to claim 1, further comprising:
fourth pixels juxtaposed with the third pixels in the second direction in the third region,
wherein the fourth pixels juxtaposed with the first pixels and the second pixels in the first direction have therein the second photodiode and the third photodiode, and
wherein in the fourth pixels, the third photodiode is placed at a position closer to the second region than the second photodiode is.

3. The semiconductor device according to claim 2,
wherein in the third region, a plurality of the third pixels and a plurality of the fourth pixels are each arranged in the first direction.

4. The semiconductor device according to claim 1, further comprising:
fifth pixels juxtaposed with the third pixels in the second direction in the third region,
wherein the fifth pixels juxtaposed with the first pixels and the second pixels in the first direction have therein the first photodiode and the fourth photodiode, and
wherein in the fifth pixels, the fourth photodiode is placed at a position closer to the second region than the first photodiode is.

5. The semiconductor device according to claim 1, further comprising:
sixth pixels juxtaposed with the third pixels in the first direction in the third region,
wherein the sixth pixels have therein the second photodiode and the third photodiode, and
wherein in the sixth pixels, the third photodiode is placed at a position closer to the second region than the second photodiode is.

6. The semiconductor device according to claim 5, further comprising:
fourth pixels juxtaposed with the third pixels in the second direction and seventh pixels juxtaposed with the sixth pixels in the second direction in the third region,
wherein the fourth pixels and the seventh pixels each have therein the second photodiode and the third photodiode,
wherein in the fourth pixels, the third photodiode is placed at a position closer to the second region than the second photodiode is, and
wherein in the seventh pixels, the second photodiode is placed at a position closer to the second region than the third photodiode is.

7. The semiconductor device according to claim 5, further comprising:
eighth pixels juxtaposed with the third pixels in the second direction and fifth pixels juxtaposed with the sixth pixels in the second direction in the third region,
wherein the fifth pixels and the eighth pixels each have therein the first photodiode and the fourth photodiode,
wherein in the fifth pixels, the fourth photodiode is placed at a position closer to the second region than the first photodiode is, and
wherein in the eighth pixels, the first photodiode is placed at a position closer to the second region than the fourth photodiode is.

8. The semiconductor device according to claim 1,
wherein in the third region, the third pixels are placed in matrix form in the first direction and the second direction.

9. The semiconductor device according to claim 1, further comprising:
ninth pixels juxtaposed with the third pixels in the second direction in the third region,
wherein in the third region, a plurality of the third pixels and a plurality of the ninth pixels are juxtaposed, respectively, in the first direction,
wherein the ninth pixels each have therein the first photodiode and the fourth photodiode, and
wherein in the ninth pixels, the first photodiode is placed at a position closer to the second region than the fourth photodiode is.

10. The semiconductor device according to claim 1,
wherein the second photodiode and the third photodiode in the third region have an area greater than that of the second photodiode and the third photodiode in the first region and the second region in plan view.

11. The semiconductor device according to claim 1,
wherein the second photodiode and the third photodiode in the third region have an area smaller, in plan view, than that of the second photodiode and the third photodiode in the first region and the second region.

12. The semiconductor device according to claim 1,
wherein the second photodiode in the third region has an area greater, in plan view, than that of the second photodiode in the first region, and
wherein the third photodiode in the third region has an area smaller, in plan view, than that of the third photodiode in the second region.

13. A semiconductor device having a solid state image sensor comprising:
a semiconductor substrate having a first region, a third region, and a second region arranged in order of mention in a first direction along a main surface of the substrate;
a first pixel and a fourth pixel juxtaposed in a second direction orthogonal to the first direction in the first region;
a second pixel and a fifth pixel juxtaposed in the second direction in the second region;
a third pixel and a sixth pixel juxtaposed in the second direction in the third region; and
a first photodiode, a second photodiode, a third photodiode, a fourth photodiode, a fifth photodiode, a sixth photodiode, a seventh photodiode, an eighth photodiode, a ninth photodiode, a tenth photodiode, an eleventh photodiode, and a twelfth photodiode formed on the main surface of the semiconductor substrate,
wherein the first pixel, the second pixel, and the third pixel are juxtaposed with each other in the first direction,
wherein the fourth pixel, the fifth pixel, and the sixth pixel are juxtaposed with each other in the first direction,
wherein the first pixel has therein the first photodiode and the second photodiode juxtaposed in order of mention in the first direction,
wherein the second pixel has therein the third photodiode and the fourth photodiode juxtaposed in order of mention in the first direction,
wherein the third pixel has therein the fifth photodiode and the sixth photodiode,
wherein the fourth pixel has therein the seventh photodiode and the eighth photodiode juxtaposed in order of mention in the first direction,
wherein the fifth pixel has therein the ninth photodiode and the tenth photodiode juxtaposed in order of mention in the first direction, wherein the sixth pixel has therein the eleventh photodiode and the twelfth photodiode, wherein the third photodiode, the fourth photodiode, the fifth photodiode, the ninth photodiode, the tenth photodiode, and the eleventh photodiode are placed at a position deviated, in plan view, in one direction from the first photodiode, the second photodiode, the sixth photodiode, the seventh photodiode, the eighth photodiode, and the twelfth photodiode, wherein in the third pixel, the sixth photodiode is placed at a position closer to the second region than the fifth photodiode is, wherein in the sixth pixel, the twelfth photodiode is placed at a position closer to the second region than the eleventh photodiode is, wherein the first photodiode has an area smaller, in plan view, than that of each of the second photodiode and the sixth photodiode, wherein the third photodiode has an area smaller, in plan view, than that of each of the fourth photodiode and the fifth photodiode, wherein the eighth photodiode has an area smaller, in plan view, than that of each of the seventh photodiode and the twelfth photodiode, and wherein the tenth photodiode has an area smaller, in plan view, than that of each of the ninth photodiode and the eleventh photodiode.

14. A semiconductor device having a solid state image sensor comprising:

a semiconductor substrate having a first region, a third region, and a second region arranged in order of mention in a first direction along a main surface of the substrate;

first pixels and fourth pixels juxtaposed in a second direction orthogonal to the first direction in the first region;

second pixels and fifth pixels juxtaposed in the second direction in the second region;

third pixels and sixth pixels juxtaposed in the second direction in the third region; and a plurality of first photodiodes, a plurality of second photodiodes, a third photodiode, and a fourth photodiode formed over the main surface of the semiconductor substrate, wherein the first pixels, the second pixels, and some of the third pixels are juxtaposed in the first direction, wherein the fourth pixels, the fifth pixels, and some of the sixth pixels are juxtaposed in the first direction, wherein in the first pixels and the fourth pixels, two of the first photodiodes are juxtaposed with each other in the first direction, wherein in the second pixels and the fifth pixels, two of the second photodiodes are juxtaposed with each other in the first direction, wherein the third pixels each have therein the third photodiode;

wherein the sixth pixels each have therein the fourth photodiode, wherein the second photodiodes and the fourth photodiode are placed at a position deviated in one direction in plan view from the first photodiodes and the third photodiode, and wherein the third photodiode and the fourth photodiode each have an area greater, in plan view, than that of the first photodiodes and the second photodiodes in plan view.

15. The semiconductor device according to claim 14, wherein in the third region, seventh pixels are juxtaposed with the third pixels and the sixth pixels in the second direction, wherein the seventh pixels each has the first photodiode and the second photodiode, and wherein in the seventh pixels, the first photodiode is placed at a position closer to the second region than the second photodiode is.

* * * * *